United States Patent
Ishikawa

(10) Patent No.: US 7,962,884 B2
(45) Date of Patent: Jun. 14, 2011

(54) FLOORPLANNING APPARATUS AND COMPUTER READABLE RECORDING MEDIUM STORING FLOORPLANNING PROGRAM

(75) Inventor: Yoichiro Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 527 days.

(21) Appl. No.: 11/953,226

(22) Filed: Dec. 10, 2007

(65) Prior Publication Data
US 2008/0127016 A1    May 29, 2008

Related U.S. Application Data

(63) Continuation of application No. PCT/JP2005/011288, filed on Jun. 20, 2005.

(51) Int. Cl.
*G06F 17/50* (2006.01)
(52) U.S. Cl. ......... 716/135; 716/132; 716/118; 716/119
(58) Field of Classification Search ............ 716/2, 8–10, 716/118, 119, 132, 135
See application file for complete search history.

(56) References Cited

U.S. PATENT DOCUMENTS

| | | | |
|---|---|---|---|
| 5,191,542 A * | 3/1993 | Murofushi | 716/9 |
| 6,733,932 B2 | 5/2004 | Hamamoto et al. | |
| 2006/0075369 A1 * | 4/2006 | Dillon et al. | 716/10 |
| 2006/0242613 A1 * | 10/2006 | Fukazawa | 716/8 |
| 2008/0134120 A1 * | 6/2008 | Wang et al. | 716/10 |

FOREIGN PATENT DOCUMENTS

| | | |
|---|---|---|
| JP | 3-25953 A | 2/1991 |
| JP | 9-330983 A | 12/1997 |
| JP | 2000-20566 A | 1/2000 |
| JP | 2003-45780 A | 2/2003 |

OTHER PUBLICATIONS

International Search Report of PCT/JP2005/011288, date of mailing Sep. 20, 2005.

* cited by examiner

*Primary Examiner* — Vuthe Siek
(74) *Attorney, Agent, or Firm* — Fujitsu Patent Center

(57) ABSTRACT

The present invention is aimed to efficiently realize a reduction in size of and dead space in a semiconductor integrated circuit while securing freedom of placement and wiring of internal components of placement objects and suppressing an increase of constraints of CAD system. A floorplanning apparatus has a temporary placement section temporarily arranging a plurality of placement object blocks onto a mounting region so that at least two placement object blocks among the plurality of placement object blocks overlap each other to form an overlap region, and an optimization section changing arrangement of the internal components in at least one placement object block among the placement object blocks forming the overlap region while using the overlap region to optimize at least one placement object block.

16 Claims, 35 Drawing Sheets

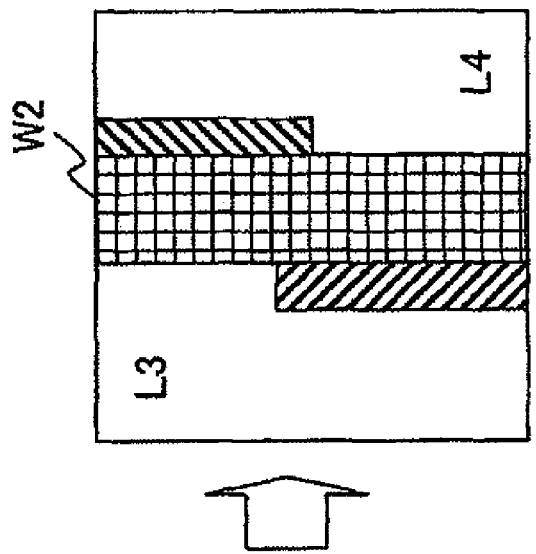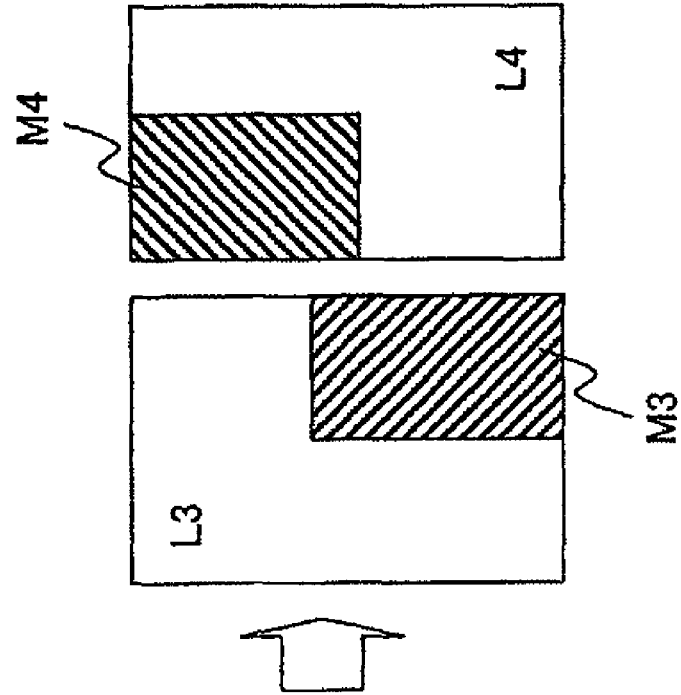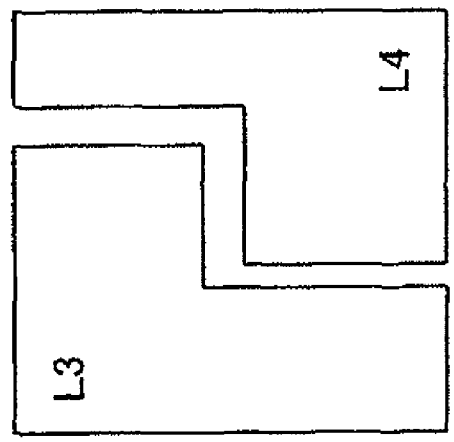

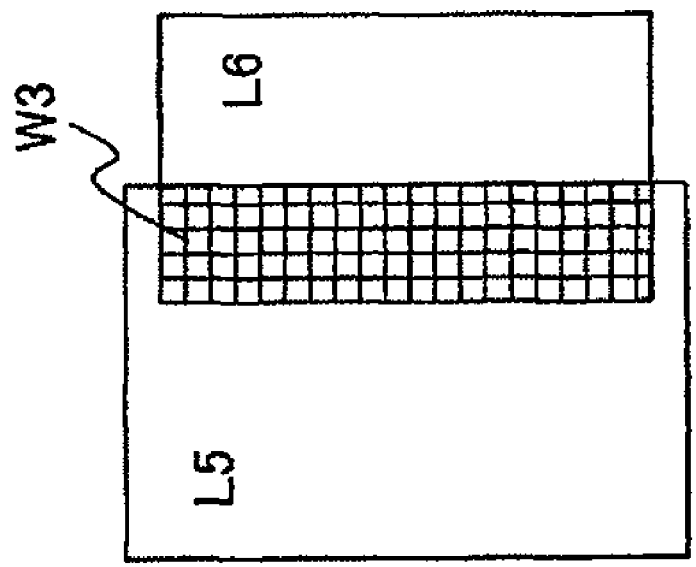
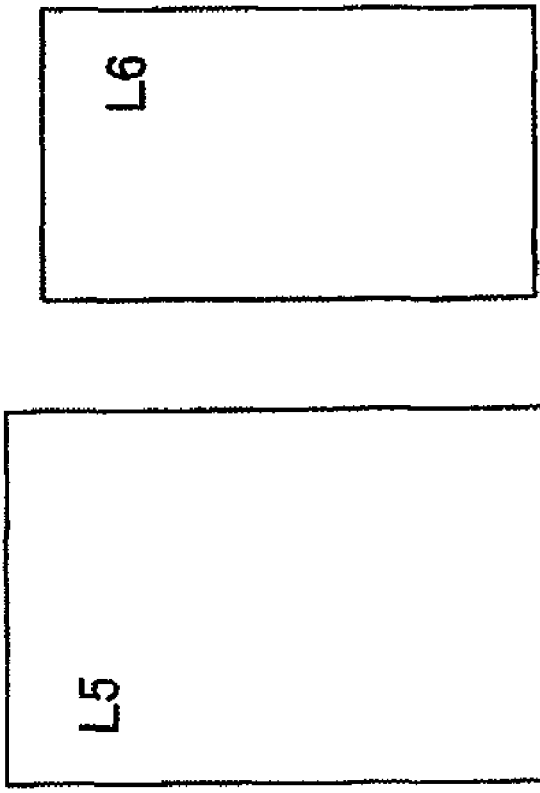

■ : INTERNAL COMPONENT
   IN PLACEMENT OBJECT L5
▨ : INTERNAL COMPONENT
   IN PLACEMENT OBJECT L6

FIG. 6

COMMON AREA ATTRIBUTE INFORMATION

| | |
|---|---|
| IDENTIFIER | :W |
| COORDINATES | :(500,500)(600,500),(600,650)(500,650) |
| CONSTITUENT | :L10, L20 |
| WHOLE AREA | :15000 |
| OCCUPIED AREA | :2600   OCCUPIED AREA RATE :17.3% |

(L10 OCCUPIED AREA :1400)   (L10 OCCUPIED AREA RATE :9.3%)
(L20 OCCUPIED AREA :1200)   (L20 OCCUPIED AREA RATE :8.0%)

NON-USED AREA :12400   NON-USED AREA RATE :82.7%

COMMON AREA NON-USED REGION AVAILABILITY INFORMATION 12b

| USE RATE (PLACEMENT:WIRING) | 1:0 | 0:1 | 1:1 |
|---|---|---|---|
| PLACE-ABLE AREA IN NON-USED REGION | 12000 | 0 | 6000 |
| THE NUMBER OF WIRE-ABLE CHANNELS IN NON-USED REGION (VERTICAL) | 0 | 280 | 140 |
| THE NUMBER OF WIRE-ABLE CHANNELS IN NON-USED REGION (HORIZONTAL) | 0 | 300 | 150 |

FIG. 8

COMMON AREA INTERNAL COMPONENT INFORMATION 12c

| No. | IDENTIFIER | COORDINATES | | AREA | POSSESSION |
|---|---|---|---|---|---|
| 1 | ram1 | (510,610) | (520,630) | 200 | L10 |
| 2 | ram2 | (530,610) | (540,630) | 200 | L10 |
| 3 | dcd1 | (520,580) | (530,590) | 100 | L10 |
| 4 | dcd2 | (540,520) | (550,530) | 100 | L20 |
| 5 | rom1 | (560,520) | (580,530) | 200 | L20 |
| 6 | dvr1 | (550,560) | (580,570) | 100 | L10 |
| 7 | WIRING RESERVATION 1 | (550,560) | (560,650) | 900 | L10 |
| 8 | WIRING RESERVATION 2 | (500,530) | (580,540) | 800 | L20 |

FIG. 9

CURRENT USE STATE (RESULTANT VALUE)

| | AREA | CONTENTS |
|---|---|---|
| L10 | 1400 | TOTAL AREA OF INTERNAL COMPONENTS |
| L20 | 1200 | TOTAL AREA OF INTERNAL COMPONENTS |
| EMPTY REGION | 12400 | AREA EXCEPTING THOSE AFOREMENTIONED |

FIG. 10

LOGIC COST EXPECTATION VALUE

| | AREA | CONTENTS |
|---|---|---|
| L10 | 3500 | TOTAL AREA OF INTERNAL COMPONENTS + CELL BOUNDARY SPACING AREA |
| L20 | 4000 | TOTAL AREA OF INTERNAL COMPONENTS + CELL BOUNDARY SPACING AREA |
| EMPTY REGION | 7500 | AREA EXCEPTING THOSE AFOREMENTIONED |

FIG. 12

MOUNTING COST EXPECTATION VALUE

| | AREA | CONTENTS |
|---|---|---|
| L10 | 6000 | TOTAL AREA OF INTERNAL COMPONENTS + CELL BOUNDARY SPACING AREA + WIRING RESERVATION AREA + TERMINAL RESERVATION AREA |
| L20 | 6000 | TOTAL AREA OF INTERNAL COMPONENTS + CELL BOUNDARY SPACING AREA + WIRING RESERVATION AREA + TERMINAL RESERVATION AREA |
| EMPTY REGION | 3000 | AREA EXCEPTING THOSE AFOREMENTIONED |

FIG. 13

OVERALL COST EXPECTATION VALUE

| | AREA | CONTENTS |
|---|---|---|
| L10 | 6910 | TOTAL AREA OF INTERNAL COMPONENTS<br>+ CELL BOUNDARY SPACING AREA<br>+ WIRING RESERVATION AREA<br>+ TERMINAL RESERVATION AREA<br>+ DISTRIBUTED EMPTY AREA |
| L20 | 7340 | TOTAL AREA OF INTERNAL COMPONENTS<br>+ CELL BOUNDARY SPACING AREA<br>+ WIRING RESERVATION AREA<br>+ TERMINAL RESERVATION AREA<br>+ DISTRIBUTED EMPTY AREA |
| EMPTY REGION | 750 | DEFAULT VALUE |

COMMON AREA USE INFORMATION

| | |
|---|---|
| WHOLE AREA | :15000 |
| COMMON AREA USED AREA | :3000 |
| (L11 USED AREA) | :1000) |
| (L21 USED AREA) | :2000) |
| NON-USED AREA | :12000 |
| SL11 WHOLE AREA | :30000 |
| SL11 USED AREA | :27000 |
| SL11 FIRST USED AREA RATE | :90% |
| SL21 WHOLE AREA | :32000 |
| SL21 USED AREA | :22700 |
| SL21 FIRST USED AREA RATE | :70% |

■ : INTERNAL COMPONENT OF L11
▨ : INTERNAL COMPONENT OF L21

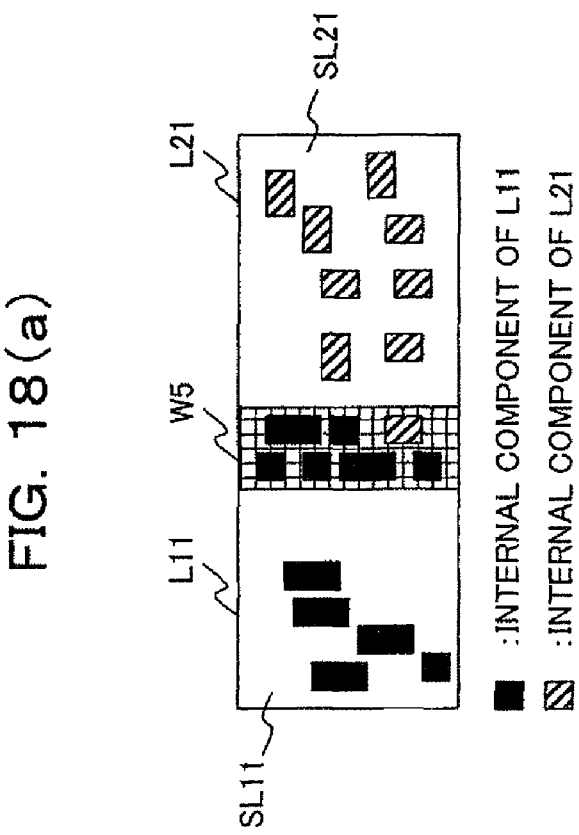

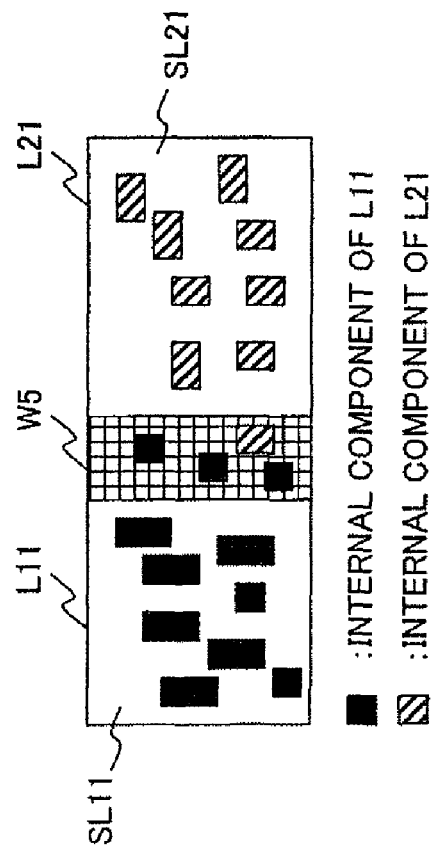

COMMON AREA USE INFORMATION

WHOLE AREA : 15000
COMMON AREA USED AREA : 14880
  (L11 USED AREA) : 9700)
  (L21 USED AREA) : 5180)
NON-USED AREA : 120

SL11 WHOLE AREA : 30000
SL11 USED AREA : 18300
SL11 FIRST USED AREA RATE : 61%
SL21 WHOLE AREA : 32000
SL21 USED AREA : 19520
SL21 FIRST USED AREA RATE : 61%

■ : INTERNAL COMPONENT OF L11
▨ : INTERNAL COMPONENT OF L21

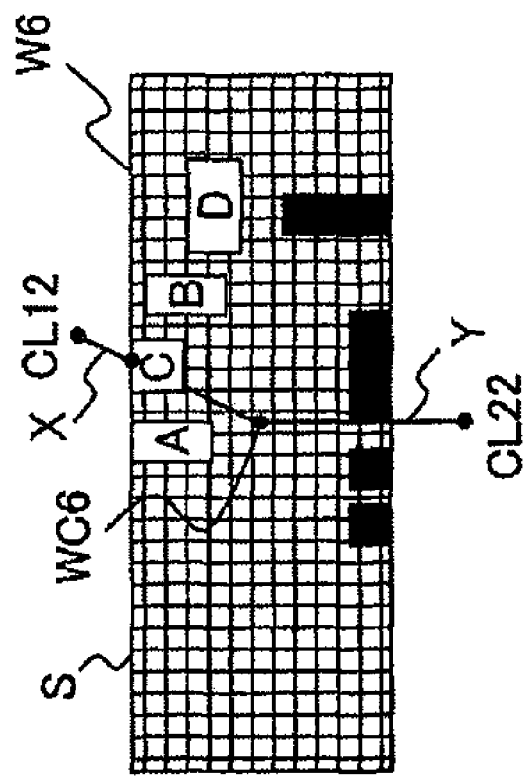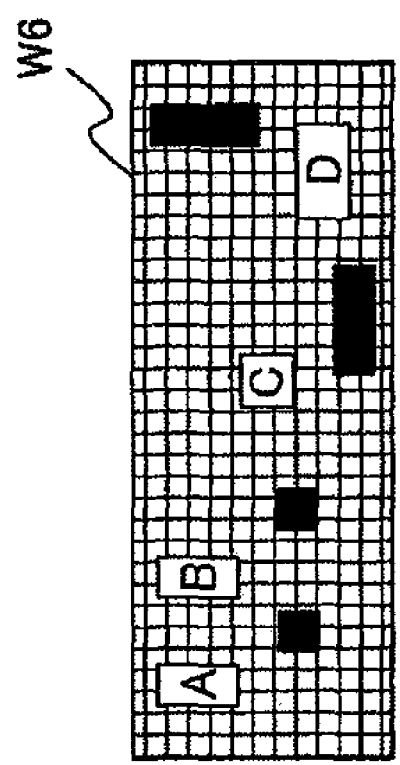

| | CONNECTION TO L12 | CONNECTION TO L22 | CONNECTION TO OTHERS |
|---|---|---|---|
| A | 60% | 0% | 40% |
| B | 60% | 10% | 30% |
| C | 100% | 0% | 0% |
| D | 50% | 40% | 10% |

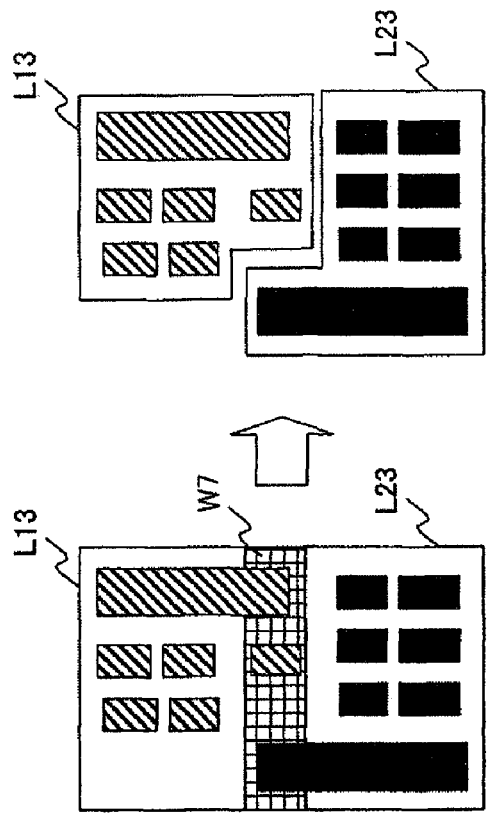
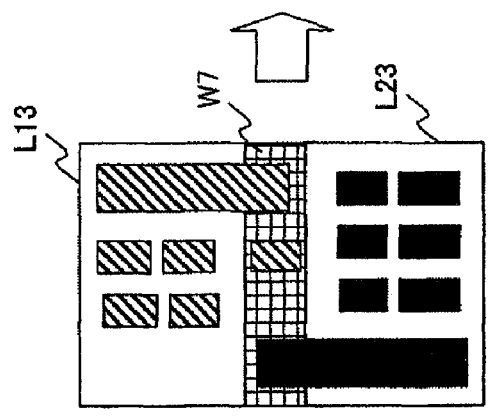
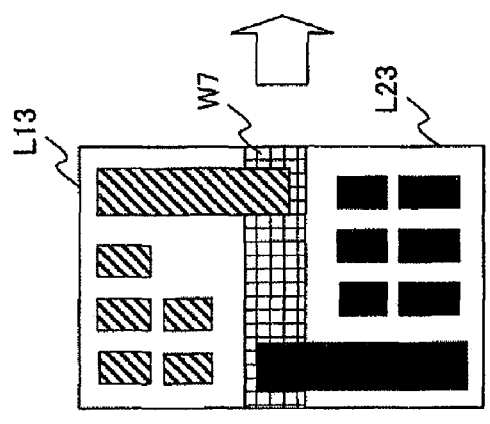
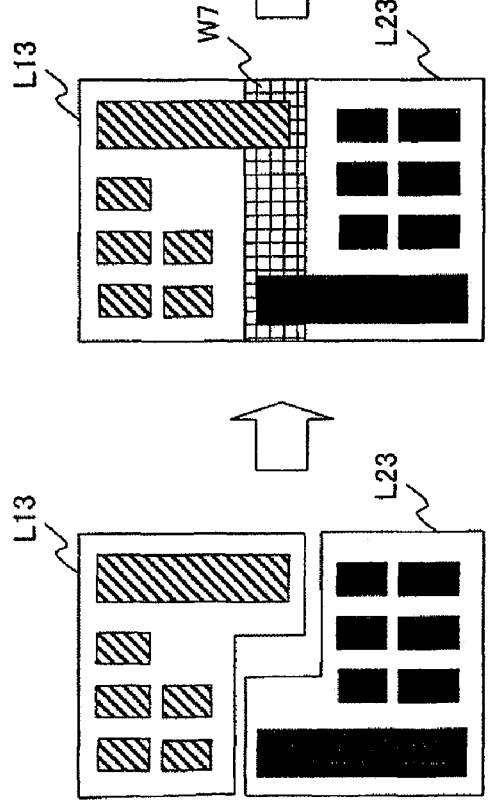

FLOORPLANNING APPARATUS AND COMPUTER READABLE RECORDING MEDIUM STORING FLOORPLANNING PROGRAM

TECHNICAL FIELD

The present invention relates to a floorplanning technique for semiconductor integrated circuit (for example, LSI: Large Scale Integrated Circuit). More specifically, the present invention relates to a technique of, in situations where shapes and dimensions of placement objects comprised of basic logic circuits are roughly determined in division hierarchical design, arranging the placement objects on a mounting region of a semiconductor integrated circuit, and determining positions of internal components in the placement object to determine the shape, dimensions and position of the placement object.

BACKGROUND ART

In the following descriptions, the placement object (the placement object block) signifies a logic function unit taking a part of the function of a semiconductor integrated circuit that is an object of floorplanning. The logic function unit corresponds to, for example, a user logic circuit (for example, sub-chip) whose position, shape and dimensions can be changed, or a mounting block (for example, LSG (Layout Sub Group) block) obtained by dividing the user logic circuit into mounting hierarchies (mounting regions).

More specifically, as shown in FIG. 32, when a semiconductor integrated circuit (Chip) 110 that is an object of floorplanning has external I/O areas (External I/O Area) 111 and a plurality of sub-chips (Sub Chip) 112, and, further, each of the plural sub-chips 112 has a plurality of mounting blocks 113 each having a plurality of internal components (devices; for example, RAM (Random Access Memory), ROM (Read Only Memory), and standard cell (Standard Cell)), the sub chip 112 or the mounting block 113 is a placement object.

Accordingly, as shown in FIGS. 33(a) to 33(c), when floorplanning at a level of the sub-chip 112 is executed, the mounting block 113 is the placement object (refer to FIGS. 33(b) and 33(c)), and when the floorplanning at a level of the semiconductor integrated circuit 110 is executed, the sub-chip 112 is the placement object (refer to FIGS. 33(a) and 33(b)).

Conventionally, when a floorplanning apparatus for semi-conductor integrated circuit (for example, LSI: (Large Scale Integrated circuit)) arranges a plurality of placement objects (placement object blocks) 102 to 105 in a placement region of the semiconductor integrated circuit 100, the floorplanning apparatus forms the placement objects 102 to 105 into rectangles and avoids overlap of the plural placement objects 102 to 105 each other, as shown in FIG. 34, for example. Incidentally, rectangular regions painted black in FIG. 34 and FIG. 35 to be described later designate internal components in the placement objects 102 to 105.

However, when the placement objects are given rectangular shapes, the areas of the placement objects 102 to 105 are increased because of placement and wiring constraints of internal components (internal cells; for example, RAM; Random Access Memory, ROM; Read Only Memory, standard cell) of the placement objects 102 to 105. This results in that the areas of the placement objects 102 to 105 are increased which leads to an increase in area of the whole semiconductor integrated circuit 100, and in that it becomes difficult that the timing of the semiconductor integrated circuit 100 falls within the prescribed cycle time (first problem).

When the placement objects 102 to 105 take rectangular shapes, a difference in density of the internal components in the placement objects becomes large due to shapes, dimensions and the number of the internal components as shown, particularly, in the placement objects 102 and 103, which causes an increase of dead spaces (second problem).

To overcome the aforementioned problems, there has been proposed a floorplanning apparatus that designs the placement objects 102' to 105' by giving a variety of arbitrary non-rectangular shapes (here, rectangular polygons) thereto, thereby to prevent the placement objects 102' to 105' from overlapping each other, as shown in FIG. 35. This floorplanning apparatus can provide a semiconductor integrated circuit 100' smaller in size than the semiconductor integrated circuit 100 while arranging placement objects 102' to 105' having the same internal components as those of the placement objects 102 to 105 shown in FIG. 34. As a result, this floorplanning apparatus can solve the above first and second problems.

To meet requirements for introduction of hierarchical layout of design, facility for design or down-sizing of semiconductor integrated circuits with an increase in scale or an increase in density of semiconductor integrated circuits, there has been provided a floorplanning apparatus which allows rectangular placement objects and non-rectangular placement objects to mingle. This floorplanning apparatus determines the order of arrangement of placement objects according to priorities of timing limitation, the number of wires, etc. to prevent a placement object from being placed on another placement object that was placed earlier than this placement object, thereby avoiding occurrence of overlap of the placement objects.

As the floorplanning technique for semiconductor integrated circuits, there have been proposed a technique of dividing a rectangular polygon generated on a layout surface into a minimum number of rectangular areas in order to shorten the design period of an integrated circuit (for example, refer to Patent Document 1 below), and a technique of preparing mask lithographic data of mask for exposing electron beams, for performing electron beam lithographic by dividing a pattern of a polygon into rectangle patterns (for example, refer to Patent Document 2 below).

Patent Document 1: Japanese Patent Laid-Open (Kokai) No. 2000-20566
Patent Document 2: Japanese Patent Laid-Open (Kokai) No. 2003-45780

DISCLOSURE OF THE INVENTION

Problems to be Solved by the Invention

However, according to the technique of giving non-rectangular shapes to the placement objects 102' to 105' described above with reference to FIG. 35, the freedom of placement and wiring is lessen because empty regions inside the placement objects 102' to 105' are decreased, and constraints on the CAD (Computer Aided Design) are increased because a variety of polygons should be handled (third problem).

In the technique using both rectangular placement objects and non-rectangular placement objects, the above first and second problems arise when rectangular placement objects neighbor each other or a rectangular and a non-rectangular placement objects neighbor each other, or the above third problem arises when non-rectangular placement objects neighbor each other.

In view of the above problems, an object of the present invention is to efficiently realize a reduction in size of and dead space in a semiconductor integrated circuit when floorplanning for the semiconductor integrated circuit is executed, while securing freedom of placement and wiring of internal components of placement objects and suppressing an increase of constraints of the CAD system.

Means for Solving the Problems

To accomplish the foregoing object, the present invention provides a floorplanning apparatus performing a process of arranging a plurality of placement object blocks, in each of which internal components are arranged, onto a mounting region, the floorplanning apparatus comprising: a temporary placement section temporarily arranging the plurality of placement object blocks onto the mounting region so that at least two placement object blocks among the plurality of placement object blocks overlap each other to form an overlap region; and an optimization section changing arrangement of the internal components in at least one placement object block among the placement object blocks forming the overlap region while using the overlap region to optimize said at least one placement object block.

It is preferable that the temporary placement section comprise: a placement section arranging the plurality of placement object blocks onto the mounting region so that the plurality of placement object blocks do not overlap each other; and an overlap region former changing a position and/or a shape of at least one placement object block among the plurality of placement object blocks arranged by the placement section to form the overlap region. At this time, it is preferable that the overlap region former deform a non-rectangular placement object into a rectangular shape.

It is preferable that the optimization section change arrangement of the internal components in at least one placement object block among the placement object blocks forming the overlap region and change a shape of the placement object block in which the arrangement of the internal components has been changed. At this time, it is preferable that the optimization section judge whether or not the internal components in the plurality of placement object blocks forming the overlap region interfere with each other in the overlap region, and change a position of at least one internal component among the internal components interfering with each other to solve the interference when judging that the internal components interfere with each other.

It is preferable that the optimization section change arrangement of the internal components with the use of at least either a rate of area (hereinafter, referred to as a first used area rate) occupied by internal components in each of the placement object blocks forming the overlap region, in an exclusive region which is obtained by taking away the overlap region from a whole area of the placement object block, or an area (hereinafter, referred to as an overlap region used area) occupied by internal components in each of the placement object blocks forming the overlap region in the overlap region. At this time, it is preferable that the optimization section move the internal components in the exclusive region of the placement object block into the overlap region to change arrangement of the internal components.

It is preferable that the optimization section change arrangement of the internal components in a placement object block having the highest first used area rate among the placement object bocks forming the overlap region so that the overlap region used area is maximized.

It is preferable that when the overlap region is formed by two placement object blocks, the optimization section change arrangement of the internal components in one placement object block having the highest first used area rate between the two placement object blocks so that the first used area rate of the one placement object block is equal to the first used area rate of the other placement object block.

It is preferable that the optimization section change arrangement of the internal components in the placement object blocks so that the overlap region used area is maximized while the first used area rates of the placement object blocks forming the overlap region are equalized.

It is preferable that the optimization section change arrangement of the internal components according to a logic cost expectation value calculated on the basis of connection relationships among the internal components within the placement object block.

It is preferable that the optimization section change arrangement of the internal components according to a mounting cost expectation value calculated on the basis of connection relationships between the internal components in the placement object block and internal components in the other placement object block.

It is preferable that the optimization section change arrangement of the internal components according to an overall cost expectation value calculated on the basis of a logic cost expectation value calculated on the basis of connection relationships among the internal components within a placement object block and a mounting cost expectation value calculated on the basis of connection relationships between the internal components in the placement object block and internal components in other placement object block.

It is preferable that the optimization section perform arrangement of the internal components in the overlap region on the basis of connection relationships among the internal components.

It is preferable that the floorplanning apparatus further comprise: a display section displaying information about the arrangement process; and an input section inputting response information for data displayed on the display section; the optimization section performing various setting on the basis of the response information inputted through the input section.

To accomplish the foregoing object, the present invention further provides a floorplanning program for causing a computer to realize a function of performing a process of arranging a plurality of placement object blocks, in each of which internal components are arranged, onto a mounting region, the floorplanning program causes the computer to function as: a temporary placement section temporarily arranging the plurality of placement object blocks onto the mounting region so that at least two plural placement object blocks among the plurality of placement object blocks overlap each other to form an overlap region; and an optimization section changing arrangement of the internal components in at least one placement object block among the placement object blocks forming the overlap region while using the overlap region to optimize the above-mentioned at least one placement object block.

It is preferable that when causing the computer to function as the temporary placement section, the floorplanning program cause the computer to function as: a placement section arranging the plurality of placement object blocks onto the mounting region so that the plural placement object blocks do not overlap each other; and an overlap region former changing a position and/or a shape of at least one placement object block among the plurality of placement object blocks arranged by the placement section to form the overlap region.

It is preferable that the floorplanning program cause the computer to function such that the optimization section changes arrangement of the internal components in at least one placement object block among the placement object blocks forming the overlap region and changes a shape of the placement object block in which the arrangement of the internal components has been changed.

To accomplish the foregoing object, the present invention still further provides a computer-readable recording medium storing the floorplanning program.

Effects Of The Invention

According to the present invention, the temporary placement section forms an overlap region, and the optimization section changes arrangement of internal components in placement object blocks forming the overlap region to optimize the placement object blocks. Accordingly, the arrangement of the internal components in the placement object blocks is re-designed so that a plurality of the placement objects share the overlap region. As a result, it is possible to reduce the size of the placement object block, and reduce the size of and dead space in the semiconductor integrated circuit.

Since the present invention does not change the shape of a placement object block into a complex polygon to reduce the size of the placement object block, it is possible to secure freedom of placement and wiring of internal components of the placement object block and suppress an increase of constraints of the CAD system.

BRIEF DESCRIPTION OF THE DRAWINGS

FIGS. 2(a) to (c) are diagrams for illustrating formation of a common area by a common area former of a temporary placement section of the floorplanning apparatus according to the embodiment of this invention, wherein FIG. 2(a) is a diagram showing placement objects arranged by a placement section of the temporary placement section, FIG. 2(b) is a diagram showing the placement objects whose shapes have been changed by the common area former, and FIG. 2(c) is a diagram showing a common area formed by the common area former;

FIGS. 3(a) to (c) are diagrams for illustrating formation of a common area by the common area former of the temporary placement section of the floorplanning apparatus according to the embodiment of this invention, wherein FIG. 3(a) is a diagram showing placement objects arranged by the placement section of the temporary placement section, FIG. 3(b) is a diagram showing the placement objects whose shapes have been changed by the common area former, and FIG. 3(c) is a diagram showing a common area formed by the common area former;

FIGS. 4(a) and (b) are diagrams for illustrating formation of a common area by the common area former of the temporary placement section of the floorplanning apparatus according to the embodiment of this invention, wherein FIG. 4(a) is a diagram showing placement objects arranged by the placement section of the temporary placement section, and FIG. 4(b) is a diagram showing a common area formed by the common area former;

FIG. 6 is a diagram showing common area attribute information obtained by the common area former of the temporary placement section displayed on a display section of the floorplanning apparatus according to the embodiment of this invention;

FIG. 7 is a diagram showing common area non-used region availability information generated by the common area former of the temporary placement section displayed on the display section of the floorplanning apparatus according to the embodiment of this invention;

FIG. 8 is a diagram showing common area internal component information obtained by the common area former of the temporary placement section displayed on the display section of the floorplanning apparatus according to the embodiment of this invention;

FIG. 9 is a diagram for illustrating contents of a resultant value that is a current use state of a common area obtained by an expectation value calculator of the floorplanning apparatus according to the embodiment of this invention;

FIG. 10 is a diagram for illustrating contents of a logic cost expectation value calculated by a logic cost expectation value calculator of the expectation value calculator of the floorplanning apparatus according to the embodiment of this invention;

FIGS. 11(a) to (e) are diagrams showing an example of the resultant value and the expectation values displayed on the display section of the floorplanning apparatus according to the embodiment of this invention, wherein FIG. 11(a) is a diagram showing the current use state of a common area obtained by the expectation value calculator, FIG. 11(b) is a diagram showing a user expectation value inputted by a user through an input section, FIG. 11(c) is a diagram showing the logic cost expectation value calculated by the logic cost expectation value calculator of the expectation value calculator, FIG. 11(d) is a diagram showing a mounting cost expectation value calculated by a mounting cost expectation value calculator of the expectation value calculator, and FIG. 11(e) is a diagram showing an overall cost expectation value calculated by an overall cost expectation value calculator of the expectation value calculator;

FIG. 12 is a diagram for illustrating contents of the mounting cost expectation value calculated by the mounting cost expectation value calculator of the expectation value calculator of the floorplanning apparatus according to the embodiment of this invention;

FIG. 13 is a diagram for illustrating contents of the overall cost expectation value calculated by the overall cost expectation value calculator of the expectation value calculator of the floorplanning apparatus according to the embodiment of this invention;

FIGS. 17(a) and (b) are diagrams showing a current use state of a common area obtained by a second placement changer of the placement changer of the optimization section, displayed on the display section of the floorplanning apparatus according to the embodiment of this invention, wherein FIG. 17(a) is a schematic view showing placement objects forming a common area along with internal components thereof, and FIG. 17(b) is a diagram showing common area use information;

FIGS. 18(a) and (b) are diagrams showing a state of the common area when the second placement changer of the placement changer of the optimization section changes arrangement of the internal components in a first mode, displayed on the display section of the floorplanning apparatus according to the embodiment of this invention, where FIG. 18(a) is a schematic diagram showing the placement objects forming the common area along with the internal components thereof, and FIG. 18(b) is a diagram showing the common area use information;

FIGS. 19(a) and (b) are diagrams showing a state of the common area when the second placement changer of the placement changer of the optimization section changes the arrangement of the internal components in a second mode, displayed on the display section of the floorplanning apparatus according to the embodiment of this invention, wherein FIG. 19(a) is a schematic diagram showing the placement objects forming the common area along with the internal components thereof, and FIG. 19(b) is a diagram showing the common area use information;

FIGS. 20(a) and (b) are diagrams showing a state of the common area when the second placement changer of the placement changer of the optimization section changes the arrangement of the internal components in a third mode, displayed on the display section of the floorplanning apparatus according to the embodiment of this invention, wherein FIG. 20(a) is a schematic diagram showing the placement objects forming the common area along with the internal components thereof, and FIG. 20(b) is a diagram showing the common area use information;

FIGS. 22(a) and (b) are diagrams for illustrating the placement changing process on internal components, wherein FIG. 22(a) is a diagram showing a common area before the placement changing process on the internal components, and FIG. 22(b) is a diagram showing the common area after the placement changing process on the internal components;

FIGS. 24(a) to (d) are diagrams for illustrating a shape changing process on placement objects by a shape changer of the optimization section of the floorplanning apparatus according to the embodiment of this invention, wherein FIG. 24(a) is a diagram showing placement objects before a common area is formed, FIG. 24(b) is a diagram showing the placement objects after the common area is formed and before the placement changing process on internal components, FIG. 24(c) is a diagram showing the placement objects after the placement changing process on the internal components, and FIG. 24(d) is a diagram showing the placement objects after the shape changing process;

FIGS. 25(a) to (d) are diagrams for illustrating the shape changing process on placement objects by the shape changer of the optimization section of the floorplanning apparatus according to the embodiment of this invention, wherein FIG. 25(a) is a diagram showing the placement objects before a common area is formed, FIG. 25(b) is a diagram showing the placement objects after the common area is formed and before the placement changing process on internal components, FIG. 25(c) is a diagram showing the placement objects after the placement changing process on the internal components, and FIG. 25(d) is a diagram showing the placement objects after the shape changing process;

FIGS. 31(a) to (d) are diagrams for illustrating the placement changing process on internal components by the placement changer of the optimization section of the floorplanning apparatus according to a modification of this invention, wherein FIG. 31(a) is a diagram showing placement objects before a common area is formed, FIG. 31(b) is a diagram showing the placement objects after the common area is formed and before the placement changing process on the internal components, FIG. 31(c) is a diagram showing the placement objects after the placement changing process on the internal components, and FIG. 31(d) is a diagram showing the placement objects after the shape changing process;

FIGS. 33(a) to (c) are diagrams for illustrating a placement object in a floorplanning process by the floorplanning apparatus according to this invention, wherein FIG. 33(a) is a diagram showing the semiconductor integrated circuit in FIG. 32 in a simplified form, FIG. 33(b) is a diagram showing one sub-chip in the semiconductor integrated circuit shown in FIG. 33(a), and FIG. 33(c) is a diagram showing one mounting block in the sub-chip shown in FIG. 33(b);

Figure 1:
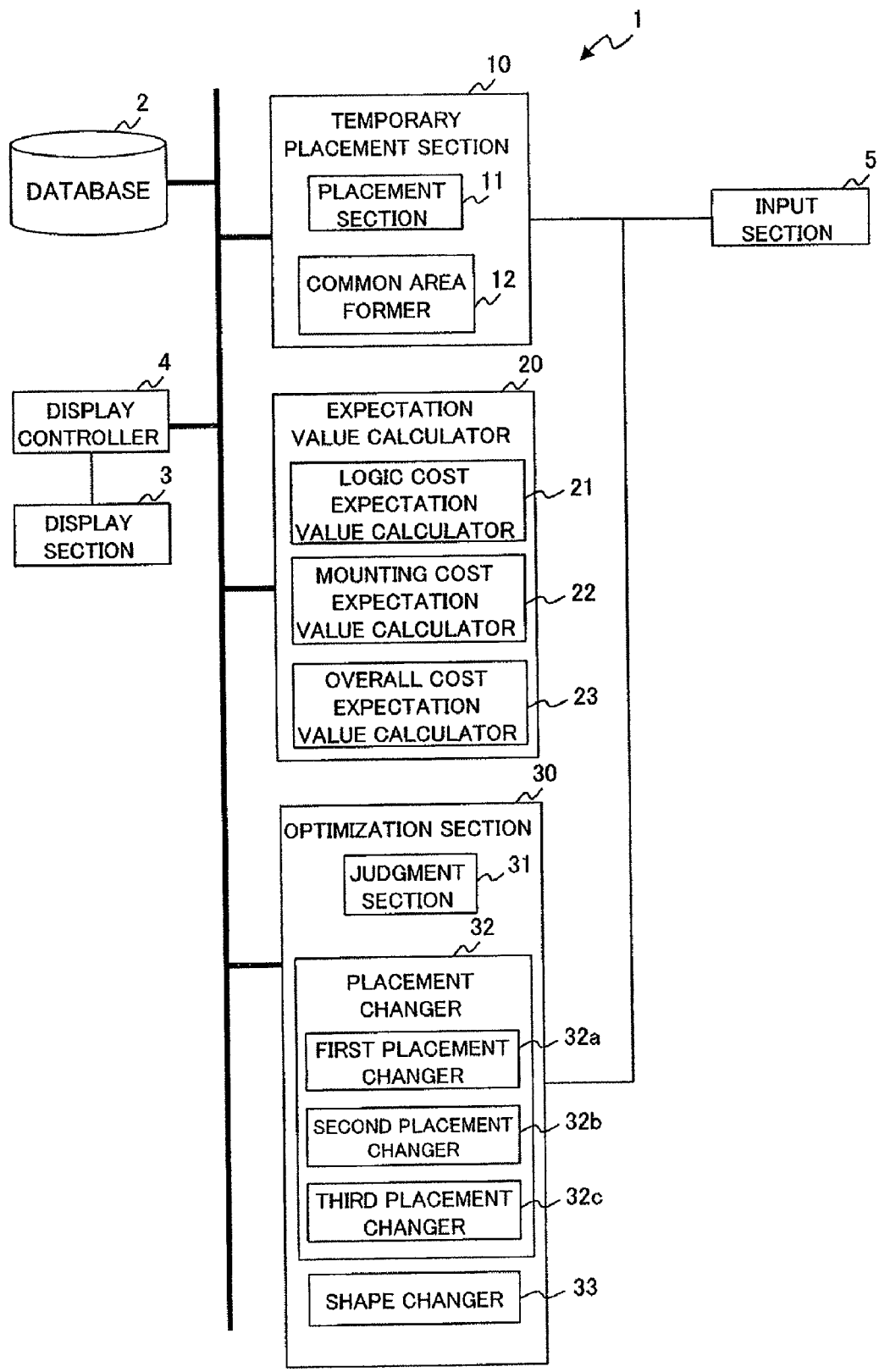
FIG. 1 is a block diagram showing a configuration of a floorplanning apparatus according to an embodiment of this invention.

EXPLANATION OF NUMERALS 1 floorplanning apparatus
2 database
3 display section
4 display controller
5 input section
10 temporary placement section
11 placement section
12 common area former (overlap region former)
20 expectation value calculator
21 logic cost expectation value calculator
22 mounting cost expectation value calculator
23 overall cost expectation value calculator
30 optimization section
31 judgment section
32 placement changer
32a first placement changer
32b second placement changer
32c third placement changer
33 shape changer
100, 100', 110 semiconductor integrated circuit
102-105, 102'-105', L1-L8, L10-L15, L20-L25 placement object (placement object block)
111 region for external input-output
112 sub-chip
113 mounting block
SL11, SL21 exclusive region
W, W1-W9 common area (overlap region)

BEST MODE FOR CARRYING OUT THE INVENTION

Hereinafter, embodiments of the present invention will be described with reference to the drawings.

[1] As to an Embodiment of the Invention

First, a floorplanning apparatus according to an embodiment of this invention will be described. FIG. 1 is a block diagram showing a configuration of a floorplanning apparatus according to an embodiment of this invention. As shown in FIG. 1, this floorplanning apparatus 1 has a database 2, a display section 3, a display controller 4, an input section 5, a temporary placement section 10, an expectation value calculator 20 and an optimization section 30.

Here, the embodiment will be described by way of example where the floorplanning apparatus 1 executes floorplanning at a level of the sub-chip 112 shown in FIGS. 32 and 33(a) through 33(c) aforementioned.

The database 2 retains data (placement object information) relating to placement objects designed in the division hierarchical design, a net list of a semiconductor integrated circuit whose floorplan is to be executed, etc.

The placement object information and the net list retained by the database 2 are obtained on the basis of results of RTL (Register Transfer Level) design (refer to step S1 in FIG. 26 to be described later) performed in the preceding stage of a floorplanning process by the floorplanning apparatus 1 in a design procedure for a semiconductor integrated circuit, and logic synthesis (refer to Step S2 in FIG. 26 to be described later).

Here, the placement object information includes at least information about dimensions, a shape of a placement object and a relationship of connection of the placement object to another placement object in a semiconductor integrated circuit to be designed, and information (the number, quantities, types, dimensions, connection relationships, etc.) about internal components of the placement object.

The display section 3 displays information about a placement process on placement objects by the temporary placement section and the optimization section 30 (refer to FIGS. 6 through 8, 15, 17(a) through 20(b) to be described later), and expectation values (refer to FIGS. 11(a) through 11(e) and 14(a) through 14(d)) calculated by the expectation value calculator 20, etc.

The display controller 4 controls contents of display on the display section 3.

The input section 5 is used to input various kinds of setting items for the floorplan by a user of the floorplanning apparatus 1 (hereinafter, simply referred to as a user). For instance, the user uses the input section 5 to input response information (various kinds of setting items) for data displayed on the display section 3.

At the input section 5, a mouse or keyboard, for example, is used as the interface.

The temporary placement section 10 temporarily arranges a plurality of placement objects (placement object blocks) on a mounting region so that at least two placement objects among the plurality of placement objects are overlapped on one another to form a common area (overlap region). The temporary placement section 10 has a placement section 11 and a common area former (overlap region former) 12.

The placement section 11 arranges a plurality of placement objects on a mounting region such that these placement objects do not overlap one another. The placement section 11 prepares placement objects on the basis of the placement object information, the net list, etc. retained in the database 2, and arranges the prepared placement objects onto the mounting region.

The common area former 12 changes the position and/or shape of at least one placement object among the plurality of placement objects arranged by the placement section 11 to form a common area.

Figure 2A:
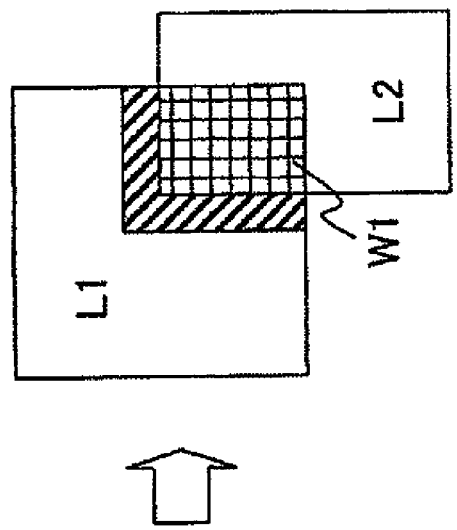
Figure 2B:
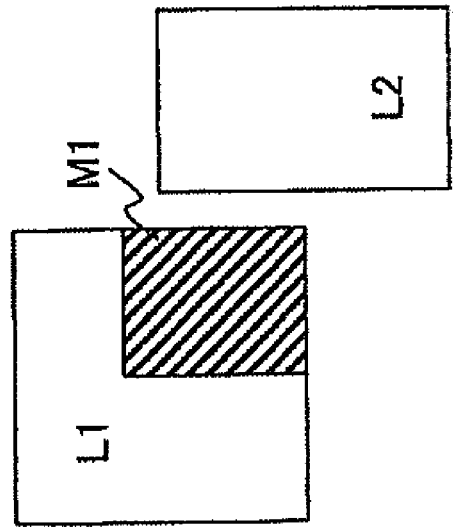
Figure 2C:
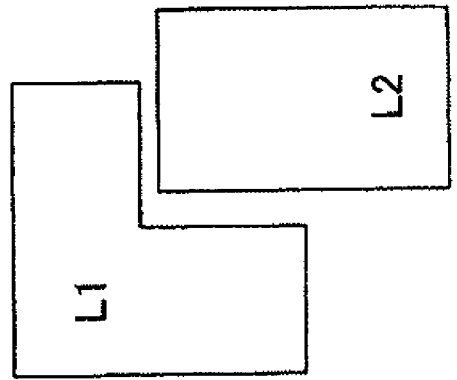

For instance, when a non-rectangular (here, rectangular polygonal) placement object L1 and a rectangular placement object L2 are arranged on a mounting region by the placement section 11 such that the placement object L1 and the placement object L2 are not overlapped as shown in FIG. 2(a), the common area former 12 adds a region M1 denoted by slanting lines to change the shape of the placement object L1 from non-rectangular to rectangular as shown in FIG. 2(b), and forms a common area W1 where the placement object L1 whose shape has been changed to rectangular and the placement object L2 are overlapped as shown in FIG. 2(c).

When two non-rectangular (here, rectangular polygonal) placement objects L3 and L4 are arranged by the placement section 11 such that the placement objects L3 and L4 are not overlapped as shown in FIG. 3(a), the common area former 12 adds regions M3 and M4 to the placement objects L3 and L4, respectively, to deform the shapes of the regions M3 and M4 to rectangular as shown in FIG. 3(b), thereby to form a common area W2 where the placement objects L3 and L4 whose shapes have been deformed are overlapped as shown in FIG. 3(c).

When two rectangular placement objects L5 and L6 are arranged by the placement section 11 such that these placement objects L5 and L6 are not overlapped as shown in FIG. 4(a), the common area former 12 changes the position of at least one placement object between the placement objects L5 and L6 to form a common area W3 where the placement objects L5 and L6 are overlapped as shown in FIG. 4(*b*).

Figure 5:
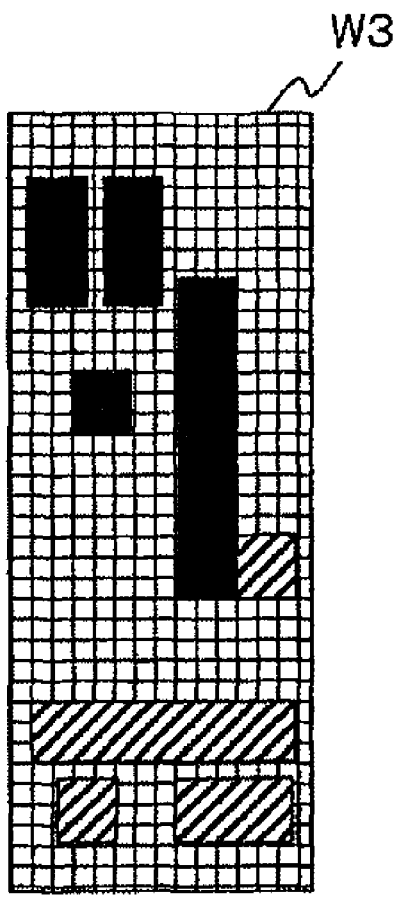
FIG. 5 is a diagram for illustrating overlap of internal components in a common area formed by the common area former of the temporary placement section of the floorplanning apparatus according to the embodiment of this invention.

Incidentally, as shown in FIG. 5, internal components of the plural placement objects L5 and L6 can be mingled in the common area W3 (refer to FIGS. 4(*a*) and 4(*b*)) formed by the common area former 12.

Meanwhile, the common area former 12 may form a common area on the basis of an instruction from the user inputted through the input section 5, or may automatically form a common area.

Figure 33:
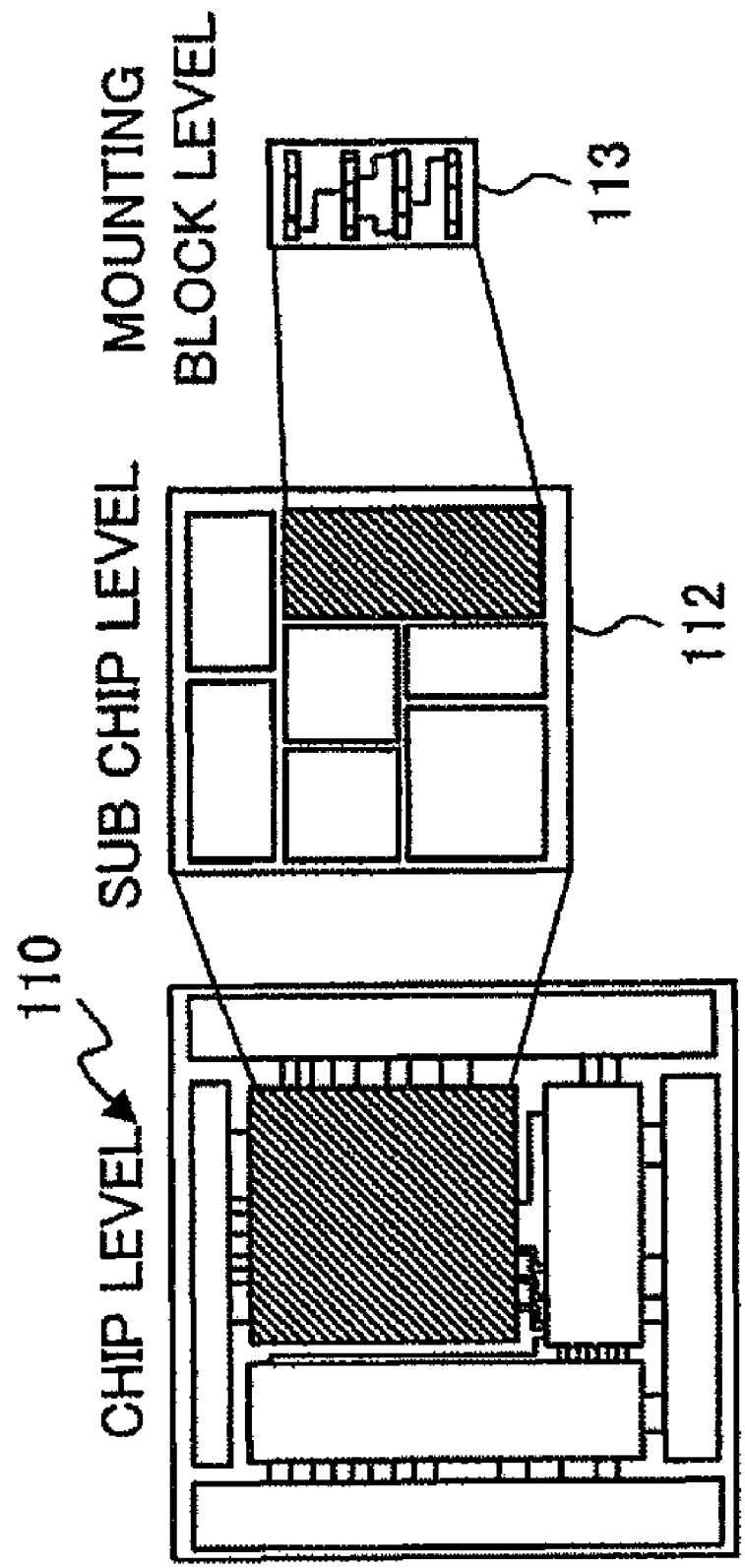
Figure 34:
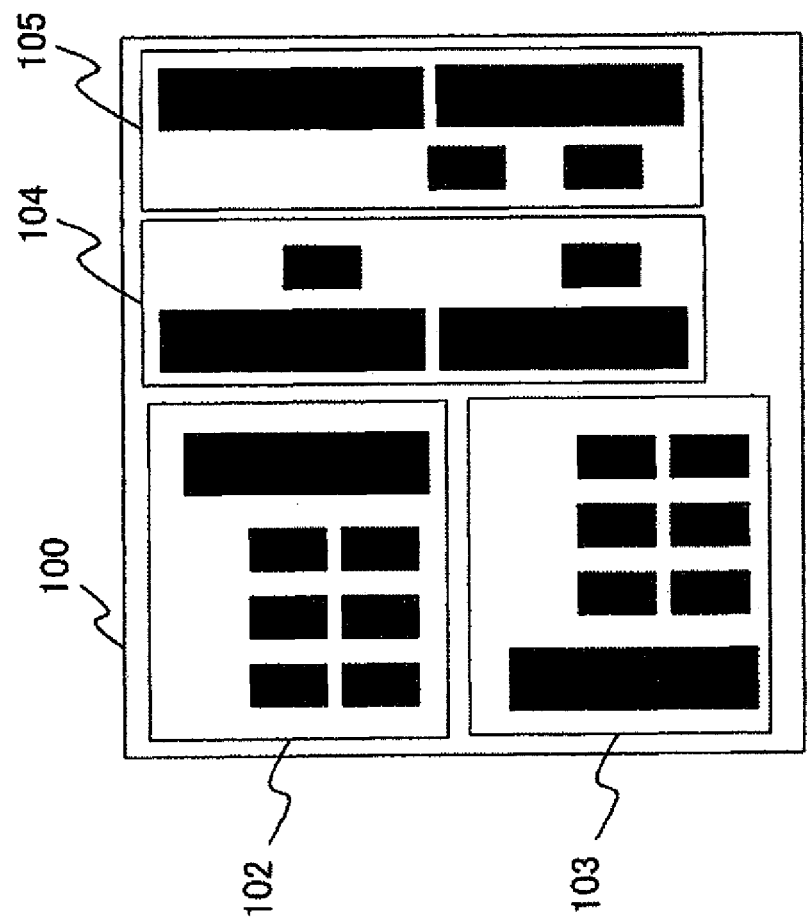
FIG. 34 is a diagram showing an example of semiconductor integrated circuit on which the floorplanning process is performed by a known floorplanning apparatus.
Figure 35:
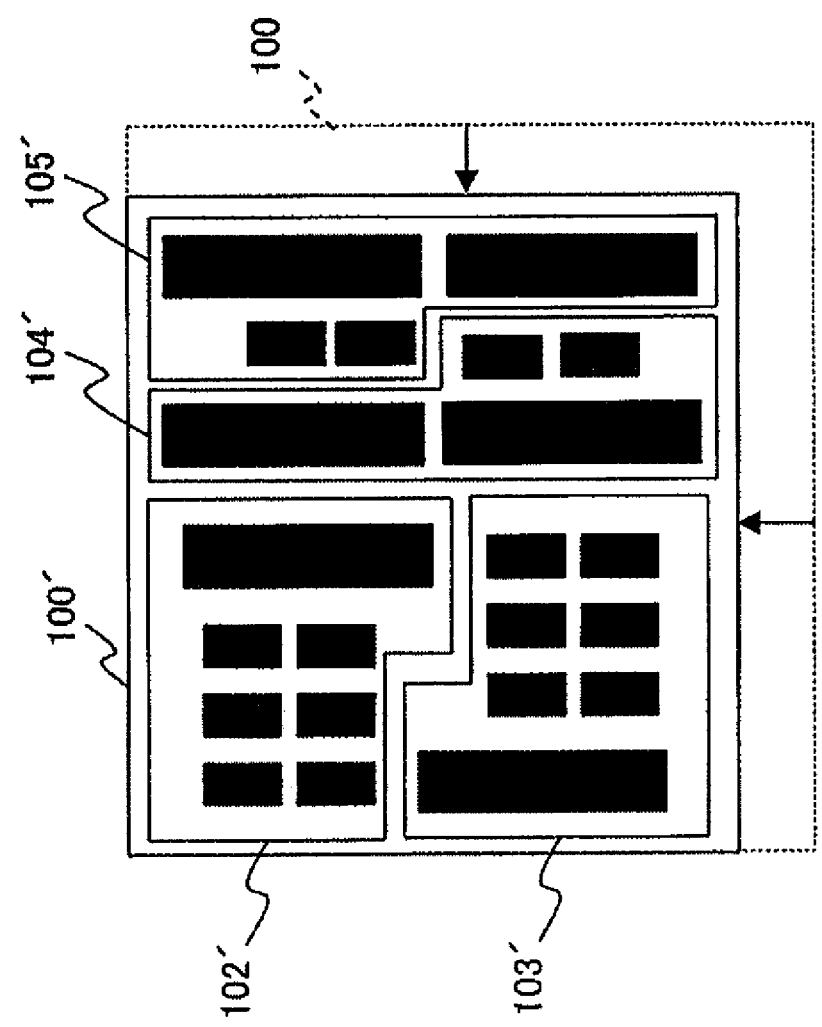
FIG. 35 is a diagram showing an example of semiconductor integrated circuit on which the floorplanning process is performed by another known floorplanning apparatus.

When the common area former 12 forms a common area on the basis of an instruction from the user, a result of arrangement of placement objects executed by the placement section 11 is displayed on the display section 3 (refer to FIG. 33(*b*), for example). The user determines a plurality of placement objects (that is, a set of placement objects) forming the common area on the basis of placement object information (for example, empty area and connection relationships) on each of the placement objects displayed on the display section 3, operates a mouse (for example, moves the mouse to move the pointer onto each desired placement object among the placement objects displayed on the display section 3, and clicks the mouse) to select placement objects that are to form the common area.

When at least one placement object in the set of placement objects selected by the user is non-rectangular, the common area former 12 deforms this placement object into rectangular to form a common area as shown in FIGS. 2(*a*) through 2(*c*) or 3(*a*) through 3(*c*).

When all placement objects in the set of placement objects selected by the user are rectangular, the common area former 12 changes the position of at least one displacement object among these plural placement objects to form a common area.

In this occasion, move of the placement object by the common area former 12 is carried out on the basis of empty areas of the plural placement objects selected by the user (that is, areas where internal components of the placement objects are not arranged).

Namely, the common area former 12 determines an area of a common area on the basis of empty areas of a plurality of placement objects forming the common area, and changes arrangement of the placement objects so as to assure the area. For example, the database 2 retains a table showing correspondence between an empty area of a placement object forming a common area and an area of the common area, and the common area former 12 determines an area of the common area on the basis of this table, and changes arrangement of the placement objects so that the common area has this area.

Even when placement objects selected by the user are non-rectangular, the common area former 12 can form a common area by only changing positions of the placement objects. In such case, the common area former 12 changes the positions of the placement objects on the basis of empty areas of the placement objects, as mentioned above.

When the common area former 12 automatically form a common area, the common area former 12 selects a plurality of placement objects (a set of placement objects) to form a common area on the basis of the placement object information (empty area, rate of empty area, relationship of connection, etc.) retained in the database 2, for example. In this case, it is preferable that a result of arrangement of the placement objects by the placement section 11 be displayed on the display section 3.

As a way of selecting a set of placement objects performed by the common area former 12, it is preferable to select placement objects whose empty areas or rates of empty area are equal to or larger than a predetermined threshold value, or to select a plurality of placement objects whose relationship of connection is large, or to select placement objects by combining the above ways.

When at least one placement object in the set of selected placement objects is non-rectangular, the common area former 12 deforms this placement object to rectangular to form a common area.

When all placement objects in the set of selected placement objects are rectangular, the common area former 12 changes the position of at least one placement object among them, thereby to form a common area, as shown in FIGS. 4(*a*) and 4(*b*) noted above.

At this time, the common area former 12 changes the position of the placement object on the basis of empty areas of the placement objects in the same manner as the user selects placement objects to form a common area.

The common area former 12 obtains common area information about a formed common area, and stores the information in the database 2.

This common area information includes common area attribute information (refer to FIG. 6 to be described later), common area non-used region availability information (refer to FIG. 7 to be described later), and common area internal component information (refer to FIG. 8 to be described later).

The common area former 12 obtains common area attribute information shown in FIG. 6 on each of formed common areas. The display controller 4 displays this common area attribute information as a screen 12*a* on the display section 3, as shown in FIG. 6.

More specifically, the common area former 12 obtains, as the common area attribute information, an identifier (here, "W") of the common area, coordinates of vertexes, names of placement objects (denoted as "constituent" in FIG. 6; here, "L10, L20") forming the common area, whole area of the common area (here, "15000"), occupied area occupied by all internal components within the common area W and occupied area rate, occupied area and rate of occupied area of internal components in each of the placement objects L10 and L20 (denoted as "L10 occupied area" and "L20 occupied area" in FIG. 6) and occupied area rates (denoted as "L10 occupied area rate" and "L20 occupied area rate"), and non-used area where no internal components are arranged within the common area W and non-used area rate.

The common area former 12 generates, as the common area information, common area non-used region availability information which estimates a place-able area for internal components in the non-used region in the common area and the number of wire-able channels in each of the horizontal and vertical directions according to a ratio of use of internal components to wiring set beforehand.

This common area non-used region availability information is displayed on the display section 3 as a screen 12*b* by the display controller 4, as shown in FIG. 7. The example shown in FIG. 7 is common area non-used region availability information generated in the case where ratios of use of placement to wiring of internal components in the common area non-used region are "1:0", "0:1" and "1:1".

In FIG. 7, a place-able area for internal components is "12000" in the case of "1:0" (when used for only placement); the numbers of wire-able channels are 280 in the vertical direction and 300 in the horizontal direction in the case of "0:1" (when used for only wiring); and the place-able area for internal components is "6000" and the numbers of wire-able channels are 140 in the vertical direction and 150 in the horizontal direction in the case of "1:1" (when used for placement and wiring half-and half).

The common area former 12 obtains, as common area information, common area internal component information about internal components in the common area. This common area internal component information includes an identifier of each internal component in the common area, coordinates of the position of the same, an area and a placement object to which this internal component belongs, as shown in FIG. 8, for example. The common area internal component information shows the initial state of the common area.

The common area internal component information is displayed on the display section 3 as a screen 12c by the display controller 4, as shown in FIG. 8. On the screen 12c in FIG. 8, coordinates of the position of each internal component are represented by two sets of coordinates of a bottom left-hand vertex and a top right-hand vertex of the internal component.

The common area information (common area attribute information, common area non-used region availability information and common area internal component information) shown in FIGS. 6 through 8 obtained by the common area former 12 is displayed on the display section 3 in order that the user determines various setting items required for an optimization process by means of the optimization section 30 to be described later.

In other words, the user refers to the common area information displayed on the display section 3 as shown in FIGS. 6 through 8, and determines how to execute the optimization process by means of the optimization section 30 to be described later (user expectation value, placement changing process mode and so forth to be described later) in consideration of contents of the common area information.

The expectation value calculator 20 calculates various kinds of cost expectation values (use expectation values of the common area obtained through cost calculation using parameters such as logic information, mounting information, etc.) which are obtained by optimizing a current resultant value on the basis of various kinds of cost information. As shown in FIG. 1, the expectation value calculator 20 has a logic cost expectation value calculator 21, a mounting cost expectation value calculator 22 and an overall cost expectation value calculator 23.

The logic coast expectation value calculator 21 calculates, as a logic cost expectation value, a used area of internal components of each placement object in a common area based on arrangement at the time that the connection relationships of the internal components are optimized in each of plural placement objects forming the common area.

More specifically, the logic cost expectation value calculator 21 calculates a logic cost expectation value on the basis of connection relationships of internal components in a placement object, calculating the logic cost expectation value for an area of the internal components in consideration of a cell boundary spacing area.

For instance, when the current use state (resultant value) in a common area W is represented as shown in FIG. 9, that is, when a total area of internal components of a placement object L10 is "1400", a total area of internal components of a placement object L20 is "1200" and an empty region is "12400" in a common area W, the logic cost expectation value calculator 21 calculates, as shown in FIG. 10, a value (here, "3500") obtained by adding a cell boundary spacing area to a total area of the internal components which are in the initial state of the placement object L10, a value (here, "4000") obtained by adding a cell boundary spacing area to a total area of the internal components which are in the initial state of the placement object L20, and a remaining empty region (here, "7500") as a logic expectation value.

Here, the cell boundary spacing area signifies a placement wiring forbidden area set outside a boundary of each cell. This area is a spacing secured beforehand outside a cell boundary in order to prevent generation of noise, short and the like due to interference of internal components of each cell with external wiring.

Meanwhile, cost expectation values (common area optimization information) calculated by the expectation value calculator 20 are displayed on the display section 3 as a bar chart 20a as shown in FIGS. 11(a) through 11(e). A logic cost expectation value calculated by the logic cost expectation value calculator 21 is displayed as shown in FIG. 11(c).

FIGS. 9, 10 and 11(a) through 11(e), and FIGS. 12 and 13 to be described later are diagrams showing optimization information for the common area W shown in FIGS. 6 through 8 described above.

As shown in FIGS. 11(a) through 11(e), in the floorplanning apparatus 1, the display controller 4 displays a current use state (resultant value; refer to FIG. 11(a)) of the common area, a user expectation value (refer to FIG. 11(b) inputted through the input section 5 by the user, and various kinds of cost expectation values calculated by the expectation value calculator 20 (a logic cost expectation value calculated by the logic cost expectation value calculator 21; refer to FIG. 11(c), a mounting cost expectation value calculated by the mounting cost expectation value calculator 22; refer to FIG. 11(d), and an overall cost expectation value calculated by the overall cost expectation value calculator 23; refer to FIG. 11(e)), as common area optimization information, in a bar chart 20a.

The current use state (resultant value) shown in FIG. 11(a) is a use state of internal components of the placement objects L10 and L20 in the current common area W, and corresponds to FIG. 9.

The user expectation value shown in FIG. 11(b) is a user's desired value (used areas of the placement objects L10 and L20 in the common area W) inputted by the user through the input section 5 with reference to the common area information shown in FIGS. 6 through 8. Here, the used area of the internal components of the placement object L10 is "7500", the used area of the internal components of the placement object L20 is "7400", and the empty area is "100".

The logic cost expectation value calculated by the logic cost expectation value calculator 21 is displayed on the display section 3 as shown in FIG. 11(c).

The mounting cost expectation value calculator 22 calculates, as a mounting cost expectation value, a used area of internal components of each of the placement objects in the common area in the case of the optimum arrangement in consideration of connection relationships of internal components in one placement object to internal components in the other placement object (that is, a connection relationship to the other placement object).

In other words, the mounting cost expectation value calculated by the mounting cost expectation value calculator 22 is calculated in consideration of a wiring reservation area for securing an area through which wiring is passed and a terminal reservation area for securing an area to which terminals are allocated. The mounting cost expectation value is represented as a used area of internal components of each placement object in the common area in the case where the connection relationships of internal components of a plurality of placement objects forming the common area are the best.

Concretely, when the logic cost expectation value calculator 21 calculates a logic cost expectation value as shown in FIG. 10, the mounting cost expectation value calculator 22 calculates, as shown in FIG. 12, a value (here, "6000") by adding a wiring reservation area and a terminal reservation area to a total area of internal components showing the initial state of the placement object L10 and a cell boundary spacing area (that is, a logic cost expectation value of the placement object L10), a value (here, "6000") by adding a wiring reservation area and a terminal reservation area to a total area of internal components showing the initial state of the placement object L20 and a cell boundary spacing area (that is, a logic cost expectation value), and other empty region (here, "3000"), as a mounting cost expectation value.

The mounting cost expectation value calculated by the mounting most expectation value calculator 22 is displayed on the display section 3 as shown in FIG. 11(d).

The overall cost expectation value calculator 23 calculates an overall cost expectation value on the basis of a logic cost expectation value calculated by the logic cost expectation value calculator 21 and a mounting cost expectation value calculated by the mounting cost expectation value calculator 22. For instance, the overall cost expectation value calculator 23 calculates an overall cost expectation value, using a rate of a logic cost expectation value to a mounting cost expectation value.

Namely, the overall cost expectation value calculator 23 calculates an overall cost of the placement object L10 using an equation (1) below, and calculates an overall cost of the placement object L20 using an equation (2) below.

$$\text{Overall cost expectation value of placement object } L10 = (\text{logic cost expectation value rate of placement object } L10 + \text{mounting cost expectation value rate of placement object } L10)/\text{the number of kinds of costs to be totaled} \times (\text{area of common area} - \text{empty region}) \quad (1)$$

$$\text{Overall cost expectation value of placement object } L20 = (\text{logic cost expectation value rate of placement object } L20 + \text{mounting cost expectation value rate of placement object } L20)/\text{the number of kinds of costs to be totaled} \times (\text{area of common area} - \text{empty region}) \quad (2)$$

Incidentally, in the above equations (1) and (2), the empty region is a default value set beforehand.

Concretely, when the logic cost expectation value calculator 21 calculates a logic cost value as shown in FIG. 10 and the mounting cost expectation value calculator 22 calculates a mounting cost expectation value as shown in FIG. 12, the overall cost expectation value calculator 23 calculates an overall cost expectation value of the placement object L10 using the following equation (1').

$$\text{Overall cost expectation value of placement object } L10 = (3500/7500 + 6000/12000)/2 \times (15000 - 750) \quad (1')$$

In this case, the overall cost expectation value calculator 23 calculates an overall cost expectation value of the placement object L20 using the following equation (2').

$$\text{Overall cost expectation value of placement object } L20 = (4000/7500 + 6000/12000)/2 \times (15000 - 750) \quad (2')$$

Accordingly, as shown in FIG. 13, the overall cost expectation value of the placement object L10 calculated by the overall cost expectation value calculator 23 is "total area of internal components of placement object L10+cell boundary spacing area+wiring reservation area+terminal reservation area+distributed empty region", thus a value of this overall cost expectation value results in "6910".

The overall cost expectation value of the placement object L20 is "total area of internal components of placement object L20+cell boundary spacing area+wiring reservation area+terminal reservation area+distributed empty region", thus a value of this overall cost expectation value results in "7340".

The empty region is a value (here, "750") set beforehand. Here, this value is so set that 5% of the whole area of the common area is the empty region.

The overall cost expectation value calculated by the overall cost expectation value calculator 23 is displayed on the display section 3 as shown in FIG. 11(e).

In the floorplanning apparatus 1, when the common area optimization information shown in FIGS. 11(a) through 11(e) is displayed on the display section 3, information (common area use constitution information) showing use constitution of each placement object in the common area shown in FIGS. 14(a) through 14(d) is displayed as a screen 20b on the display section 3, along with the common area optimization information.

Figure 14A:
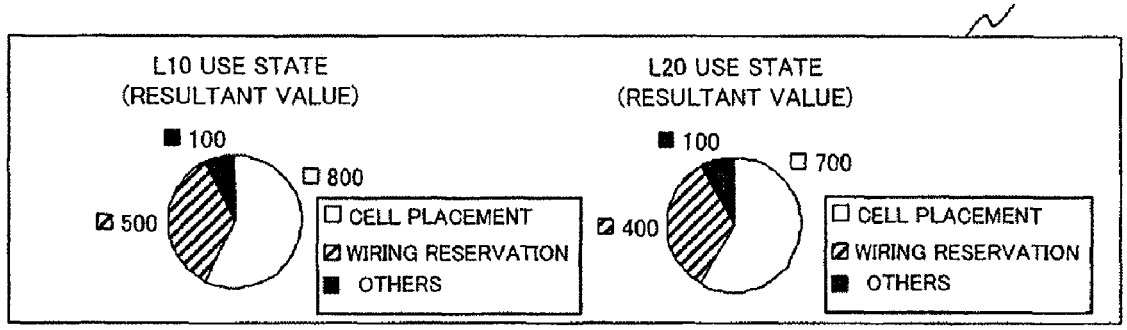
FIGS. 14(a) to (d) are diagrams showing common area use constitution information obtained or calculated by the expectation value calculator displayed on the display section of the floorplanning apparatus according to the embodiment of this invention, wherein FIG. 14(a) corresponds to the current use state (resultant value) shown in FIG. 11(a), FIG. 14(b) corresponding to the logic cost expectation value shown in FIG. 11(c), FIG. 14(c) corresponds to the mounting cost expectation value shown in FIG. 11(d), and FIG. 14(d) corresponds to the overall cost expectation value shown in FIG. 11(e)

The common area use constitution information shown in FIG. 14(a) corresponds to the current use state (resultant value) shown in FIG. 11(a), and it shows contents of internal components in the initial state of each of the placement objects L10 and L20 in the common area W. The common area use constitution information is obtained by the common area former 12.

In concrete, the common area use constitution information shows that items of a used area (total area of internal components) of "1400" of the placement object L10 in the common area are cell placement of "800", wiring reservation area of "500" and others of "100", and that items of a used area (total area of internal elements) of "1200" of the placement object L20 in the common area W are cell placement of "700", wiring reservation area of "400" and other of "100".

Figure 14B:
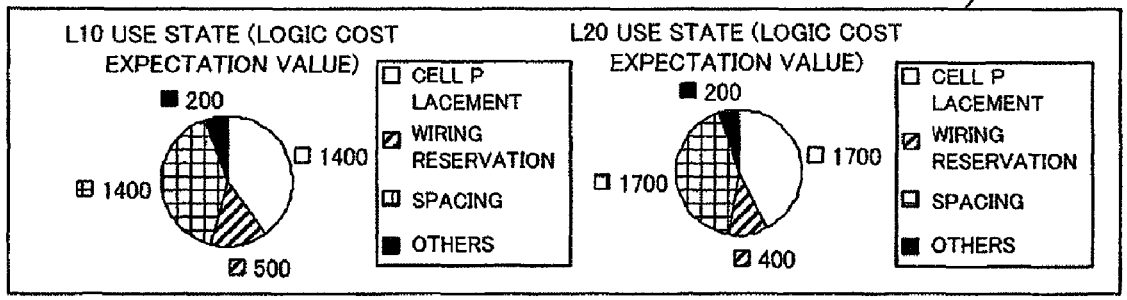

The common area use constitution information shown in FIG. 14(b) corresponds to the logic cost expectation value shown in FIG. 11(c) calculated by the logic cost expectation value calculator 21, showing contents of internal components of the placement objects L10 and L20 in the common area W in the case of this logic cost expectation value. This common area use constitution information is calculated by the logic cost expectation value calculator 21.

Concretely, the common area use constitution information shows that items of a used area of "3500" of the placement object L10 in the common area W are cell placement of "1400", a wiring reservation area of "500", a cell boundary spacing area of "1400" and others of "200", and that items of a used area of "4000" of the placement object L20 in the common area W are cell placement of "1700", a wiring reservation area of "400", a cell boundary spacing area of "1700" and others of "200".

Figure 14C:
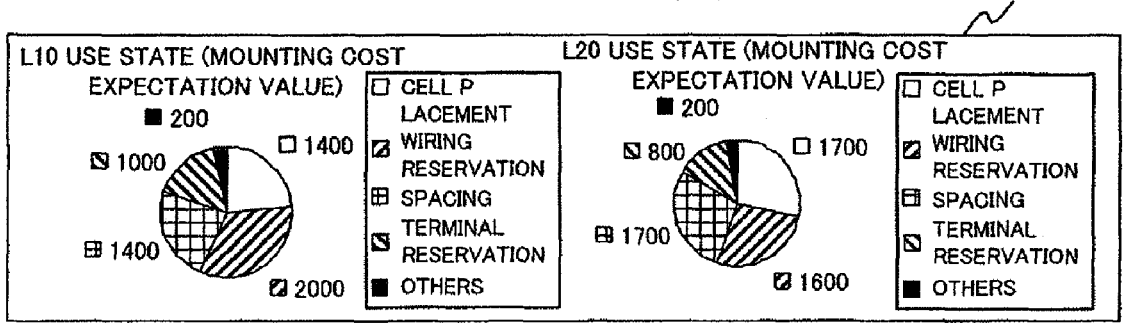

The common area use constitution information shown in FIG. 14(c) corresponds to the mounting cost expectation value shown in FIG. 11(d) calculated by the mounting cost expectation value calculator 22, showing contents of internal elements of the placement objects L10 and L20 in the common area W in the case of this mounting cost expectation value. This common area use constitution information is calculated by the mounting cost expectation value calculator 22.

In concrete, the common area use constitution information shows that items of a used area of "6000" of the placement object L10 in the common area W are cell placement of "1400", a wiring reservation area of "2000", a cell boundary spacing area of "1400", a terminal reservation area of "1000" and others of "200", and that items of a used area of "6000" of the placement object L20 in the common area W are cell placement of "1700", a wiring reservation area of "1600", a cell boundary spacing area of "1700", a terminal reservation area of "800" and others of "200".

Figure 14D:
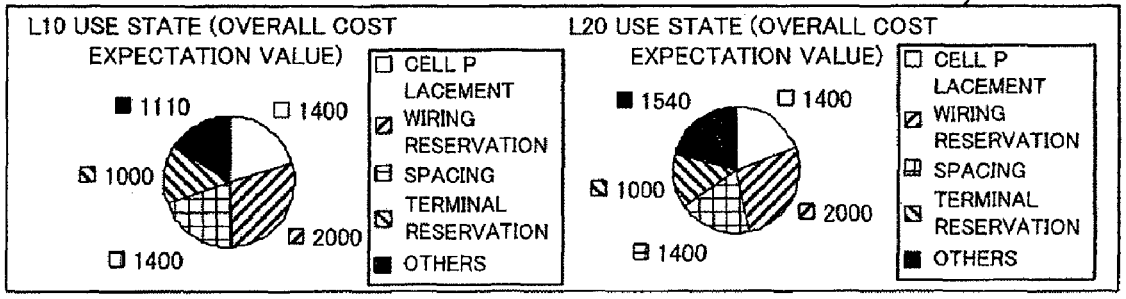

The common area use constitution information shown in FIG. 14(d) corresponds to the overall cost expectation value shown in FIG. 11(e) calculated by the overall cost expectation value calculator 23, showing contents of internal components of the placement objects L10 and L20 in the common area W in the case of this overall cost expectation value. This common area use constitution information is calculated by the overall cost expectation value calculator 23.

Concretely, the common area use constitution information shows that items of a used area of "6910" of the placement object L10 in the common area W are cell placement of "1400", a wiring reservation area of "2000", a cell boundary spacing area of "1400", a terminal reservation area of "1000" and other of "1100", and that items of a used area of "7340" of the placement object L20 in the common area W are cell placement of "1400", a wiring reservation area of "2000", a cell boundary spacing area of "1400", a terminal reservation area of "1000" and others of "1540".

The user refers to the common area optimization information (refer to FIGS. 11(a) through 11(e)) and the common area use constitution information (refer to FIGS. 14(a) through 14(d)) displayed on the display section 3, and inputs a user expectation value through the input section 5 by operating, for example, a keyboard. Then, the optimization section 30 executes the optimization process on the placement objects as will be described later on the basis of the inputted user expectation value.

The optimization section 30 changes the arrangement of internal components of at least one placement object between the placement objects forming a common area within this placement object, using this common area, thereby to optimize this placement object. As shown in FIG. 1, the optimization section 30 has a judgment section 31, a placement changer 32 and a shape changer 33.

The judgment section 31 judges whether or not internal components of a plurality of placement objects forming the common area interfere with each other (that is, whether or not overlapping of the internal components is present).

Namely, since internal components of a plurality of placement objects can mingle in the common area as having been described hereinbefore with reference to FIG. 5, the judgment section 31 judges whether or not internal components of the plural placement objects forming the common area interfere with each other on the basis of the common area internal component information (refer to FIG. 8) generated by the common area former 12.

Figure 15:
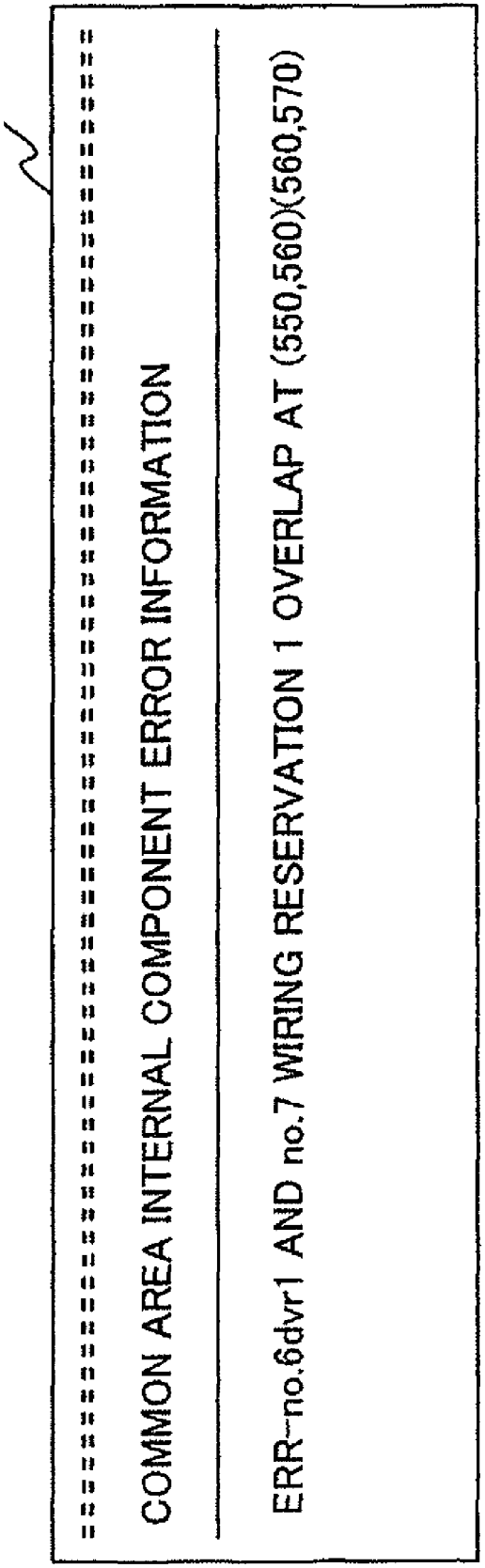
FIG. 15 is a diagram showing common area internal component error information obtained by a judgment section of an optimization section displayed on the display section of the floorplanning apparatus according to the embodiment of this invention.

When the judgment section 31 judges with respect to the common area W shown in FIGS. 6 through 8, for example, that internal components (here, "dvr1" and "wiring reservation area 1") of the plural placement objects forming the common area W interfere with each other, the judgment section 31 displays common area internal components error information for notifying the user of this interference as a screen 31a on the display section 3, as shown in FIG. 15.

The placement changer 32 changes arrangement of internal elements of at least one placement object among the plural placement objects forming the common area on the basis of an instruction from the user (here, user expectation value; refer to FIG. 11(b)) inputted through the input unit 5. The placement changer 32 optimizes this placement object by changing the arrangement of the internal elements.

When the judgment section 31 judges that the internal components of the plural placement objects forming the common area interfere with each other, the placement changer 32 changes arrangement of at lease one internal component between the internal elements interfere with each other in order to solve this interference.

The placement changer 32 has a first placement changer 32a, a second placement changer 32b and a third placement changer 32c.

The first placement changer 32a selects one kind of cost expectation value among plural kinds of cost expectation values (logic cost expectation value, mounting cost expectation value and overall cost expectation value; refer to FIGS. 11(c) through 11(e)) calculated by the expectation value calculator 20 on the basis of a user expectation value (refer to FIG. 11(b)) inputted by the user through the input section 5, and changes arrangement of internal components of the placement objects forming the common area on the basis of the selected cost expectation value.

In concrete, the first placement changer 32a selects one expectation value to be employed for a placement changing process among cost expectation values (logic cost expectation value, mounting cost expectation value and overall cost expectation value), with an expectation value judgment function $f$ expressed by an equation (3) below.

$$\text{Expectation value judgment function } f = \min|\text{user expectation value} - \text{each cost expectation value}| \quad (3)$$

The first placement changer 32a selects a cost expectation value having the smallest absolute value that is obtained by subtracting each cost expectation value from the user expectation value as the cost expectation value to be employed for the placement changing process.

In the examples shown in FIGS. 11(a) through 11(e), the first placement changer 32a selects the overall cost expectation value (refer to FIG. 11(e)) on the basis of the above equation (e), for example.

On the basis of this overall cost expectation value, the first placement changer 32a arranges a cell boundary spacing, a wiring reservation area and a terminal reservation area of each of the placement objects L10 and L20 and a distributed empty region, along with cells to which the placement objects L10 and L20 belong, in the common area W.

According to the resultant value at the time that the common area W is formed (the initial state), only cell of the placement objects L10 and L20 are arranged in the common area, as shown in FIG. 9 above mentioned. However, the first placement changer 32a selects the overall cost expectation value (refer to FIG. 13) on the basis of the user expectation value, arranges the cells on the basis of this overall cost expectation value in consideration of the cell boundary spacing, then newly arranges a wiring reservation area and a terminal reservation area of each of the placement objects L10 and L20 and a distributed empty region in the common area W, thereby to optimize the placement objects L10 and L20.

Figure 16:
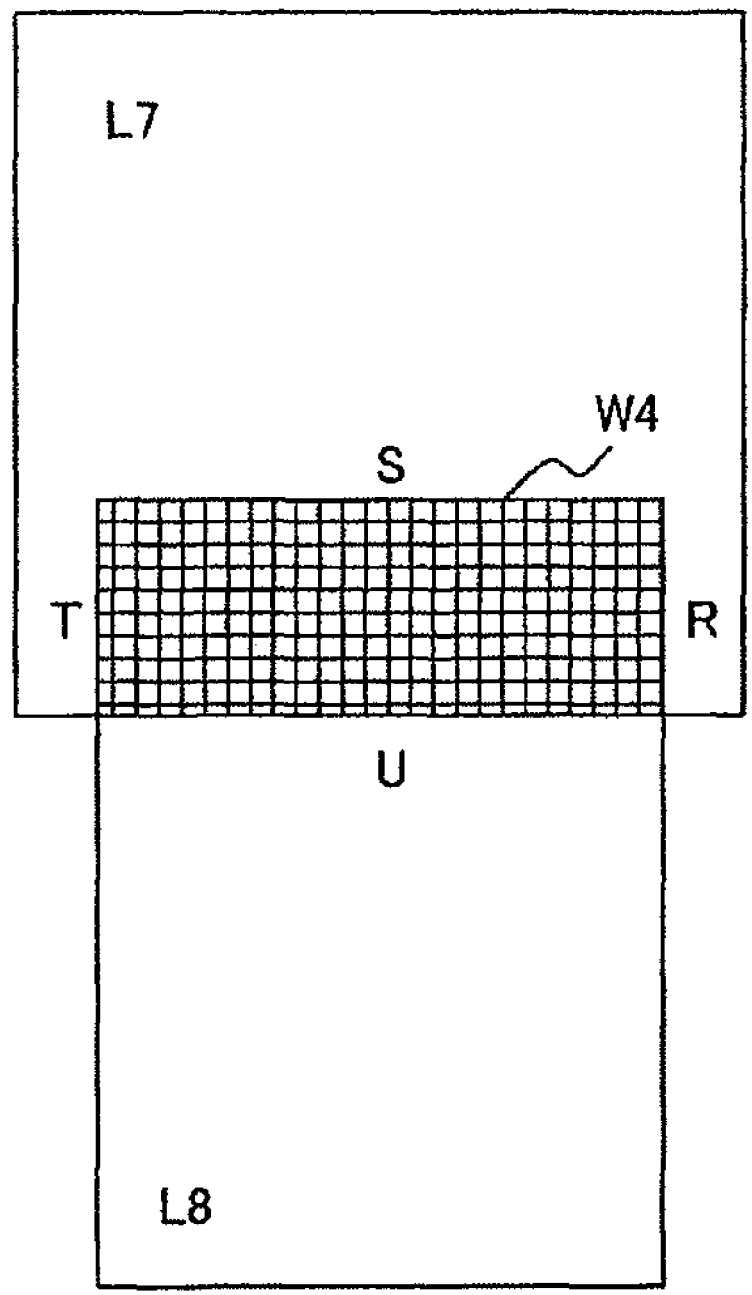
FIG. 16 is a diagram for illustrating arrangement of internal components within a common area by a first placement changer of a placement changer of the optimization section of the floorplanning apparatus according to the embodiment of this invention.

For example, when a common area W4 is formed by placement objects L7 and LB as shown in FIG. 16, it is preferable that the placement object changer 32a arrange internal components (internal components based on a selected cost expectation value) of the placement object L7 such that the internal components are rather gathered along any one of sides R, S and T of the common area W4, and arrange internal components of the placement object LB such that the internal components are rather gathered along one side among sides R, T and U of the common area W where the internal components of the placement objects L7 are not gathered. Whereby, it is possible to reduce the areas of the placement objects (here, the placement objects L7 and LB) through a shape changing process by the shape changer 33 to be described later.

The second placement changer 32b changes arrangement of internal elements with the use of at least either a rate of used area (hereinafter, referred to as a first used area rate) occupied by internal components in an exclusive area that is an area obtained by excluding a common area from the whole region of each of placement objects forming the common area or a used area (common area used area; overlapped area used area) occupied by internal components of each of the placement objects forming the common area within the common area.

In the floorplanning apparatus 1, the second placement changer 32b functions when internal components positioning outside the common area are assigned into the common area, that is, when an empty region exists in the common area and the user determines to aggressively use the common area. In the floorplanning apparatus 1, the second placement changer 32b operates in any one of three modes (modes), first to third modes (refer to FIGS. 18 through 20 to be described later), on the basis of an instruction from the user through the input section 5.

Figures 17A, 17B:
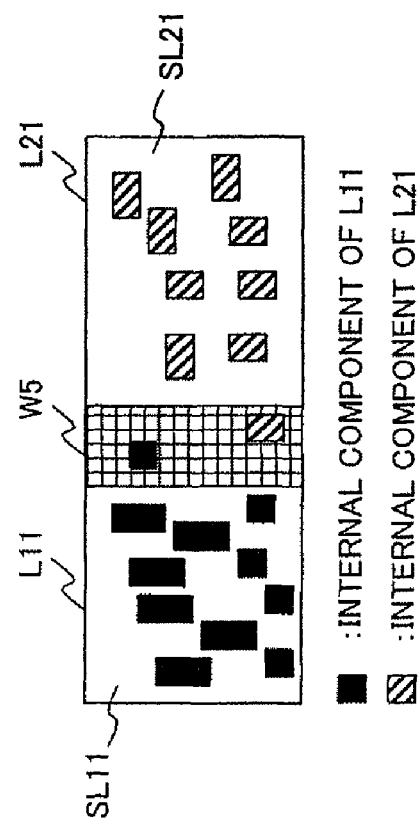

First, the second placement changer 32b displays the current use state (resultant value) on the display section 3 as shown in FIGS. 17(a) and 17(b), for example. FIG. 17(a) is a schematic view showing placement objects L11 and L21 forming a common area W5 at the current point of time, whereas FIG. 17(b) shows common area use information on the common area W5.

In FIG. 17(a) and FIGS. 18(a), 19(a) and 20(a) to be described later, reference numeral "SL11" denotes an exclusive region (hereinafter, referred to as exclusive region SL11) which is a region obtained by excluding the common area W5 from the placement object L11 within the placement object L11, and reference numeral "SL21" denotes an exclusive region (hereinafter, referred to as exclusive region SL21) which is a region obtained by excluding the common area W5 from the placement object L21 within the placement object L21.

Now, the common area use information shown in FIG. 17(b) will be explained. The common area use information includes a whole area (denoted as "whole area" in the drawing) of a common area, a used area of internal components of placement objects L11 and L21 in the common area W5 (common area used area; denoted as "common area used area" in the drawing) and items thereof (denoted as "L11 used area" and "L21 used area" in the drawing), non-used area, a whole area of the exclusive area L11 (denoted as "SL11 whole area" in the drawing), a used area of internal component in the exclusive region SL11 (denoted as "SL11 used area" in the drawing), a first used area rate of the exclusive region SL11 (denoted as "SL11 first used area rate" in the drawing), a whole area of the exclusive region SL21 (denoted as "SL21 whole area" in the drawing), a used area of internal components in the exclusive region SL21 (denoted as "SL21 used area" in the drawing), and a first used area rate of the exclusive region SL21 (denoted as "SL21 first use area rate in the drawing).

Figures 20A, 20B:
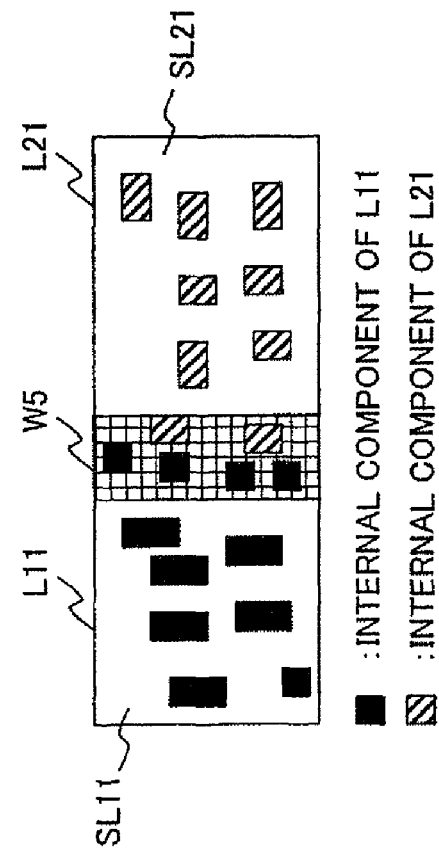

Common area information shown in FIGS. 18(b), 19(b) and 20(b) includes the same kinds of information as those shown in FIG. 17(b).

When the user so sets as to assign internal components outside the common area into the common area through the input section 5 (that is, when the placement changing process by the second placement changer 32b is executed), FIGS. 17(a) and 17(b) may be displayed on the display section 3 by the display controller 4.

In order to solve a problem that the first used area rate (degree of placement congestion) of any one of placement objects forming the common area is high, the second placement changer 32b changes arrangement of internal components of a placement object having the highest first used area rate among the placement objects forming the common area (that is, assigns internal components into the common area) as a first mode so that the common area used area is maximized.

Concretely, assuming that the exclusive region SL11 has an area of "30000" and the first use area rate of "90%" and the exclusive area SL21 has an area of "32000" and a use rate of "70%"; a used area of the placement object L11 is "1000" and a used area of the placement object L21 is "2000" for an area of "15000" of the common area W5; and a non-used area is "12000".

At this time, the non-used area of "12000" of the common area W5 corresponds to 40% of the area of "30000" of the exclusive area SL11 of the placement object L11 having the highest first used area rate. So, the second placement changer 32b moves internal components of the placement object L11 corresponding to up to 40% of the whole area ("12000" when expressed in terms of area) into the common area W5.

Since there is a case that a total area of internal components to be moved into the common area does not come to exactly "12000", the total area thereof is set as "up to 40%" ("12000") here.

As shown in FIGS. 18(a) and 18(b), in the first mode, the second placement changer 32b moves internal components of the placement object L11 having the highest first used area rate into the common area W5 so that the common area used area of the common area W is maximized. As a result, the used area of the placement object SL11 in the common area W5 is "13000", the non-used area of the common area W5 is "0", and the first used area rate of the SL11 is "50%".

In order to solve a problem that the first used area rate (degree of placement congestion) of any one of the placement objects forming the common area is high, the second placement changer 32b assigns internal components of a placement object having a high first used area rate into the common area, as a second mode, so that all the plural placement objects forming the common area have the lowest first used area rate obtained at the time of the initial state. In other words, the constitution of use of the common area is determined with a parameter that equalizes the first used area rates of the plural placement objects forming the common area to reduce a higher first used area rate to a lower one.

Equalizing the first used area rates of a plurality of placement objects forming the common area in the second mode is useful to solve a problem that any one of the placement objects is congested, and is also effective to secure a wiring reservation area.

Concretely, in the case shown in FIGS. 17(a) and 17(b), the placement object L11 has an exclusive region SL11 of "30000" and a first used area rate of "90%", whereas the placement object L21 has an area of "32000" and a first used area rate of "70%". In order to match the first used area rate of the exclusive region SL11 to the first used area rate of the exclusive region SL21 (that is, in order to change the SL11 first used area rate to "70%"), the placement changer 32b calculates internal components that correspond to 20% of the exclusive region SL11 of the placement object L11, and moves the calculated internal components into the common area W5.

As shown in FIGS. 19(a) and 19(b), in the second mode, the placement changer 32b moves internal components occupying an area of "6000", which corresponds to 20% of the whole area of the placement object L11, from the exclusive region SL11 into the common area W5, thereby to make both the SL11 first used area rate and the SL21 first used area rate be "70%".

At this time, the common area used area is "9000", items of which are that the used area of the placement object L11 is "7000", the used area of the placement object L21 is "2000", and the non-used area of the common area W5 is "6000".

In order to use the common area most effectively while solving a problem that any one of the first used area rates (degree of placement congestion) of the placement objects forming the common area is high, the second placement changer 32b assigns internal components of the plural placement objects into the common area, as a third mode, so that the common area used area is maximized while the first used area rates of all the plural placement objects forming the common area are equalized.

In concrete, in the case shown in FIGS. 17(a) and 17(b), the second placement changer 32b calculates a value that can minimize the non-used area of the common area W5 while equalizing the first used area rate of the exclusive region SL11 and the first used area rate of the exclusive region SL21, sets "9700" to the used area of the placement object L11 and "5180" to the use area of the placement object L21, and sets "120" to the non-used area while giving the same first use area rates (here, "61%") to the exclusive regions SL11 and SL21.

The third placement changer 32c performs arrangement of internal components in the common area on the basis of connection relationships of the internal components. The third placement changer 32c further changes arrangement of internal components within a common area that has been undergone the placement changing process by the first placement changer 32a and the second placement changer 32b, for example.

First, the third placement changer 32c examines connection relationships of internal components in the common area. Then, the third placement changer 32c changes the arrangement in such a way that an internal component having a higher rate of connection to a placement object to which this internal component belongs is arranged at a position closer to an intersection of a straight line connecting the center of the common area to the center (or the center of gravity) of its placement object and a side of the common area crossing this straight line.

The connection relationships may be a net-list of logic, or may be wiring relationships in mounting or connection relationships of bus signal lines in floorplan, for example.

Figure 21:
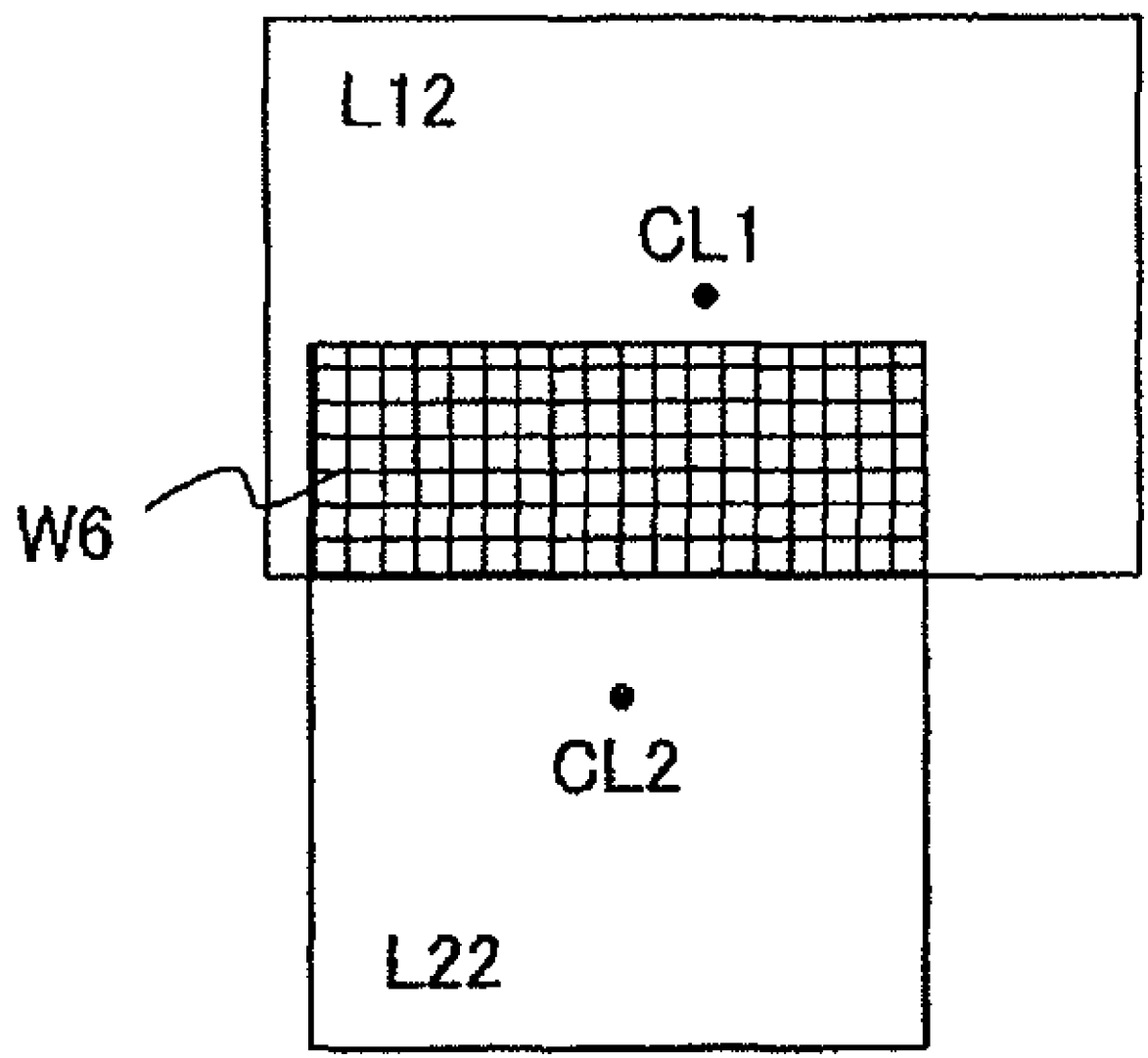
FIG. 21 is a diagram for illustrating a placement changing process on internal components by a third placement changer of the placement changer of the optimization section of the floorplanning apparatus according to the embodiment of this invention, and showing placement objects forming a common area.
Figure 23:
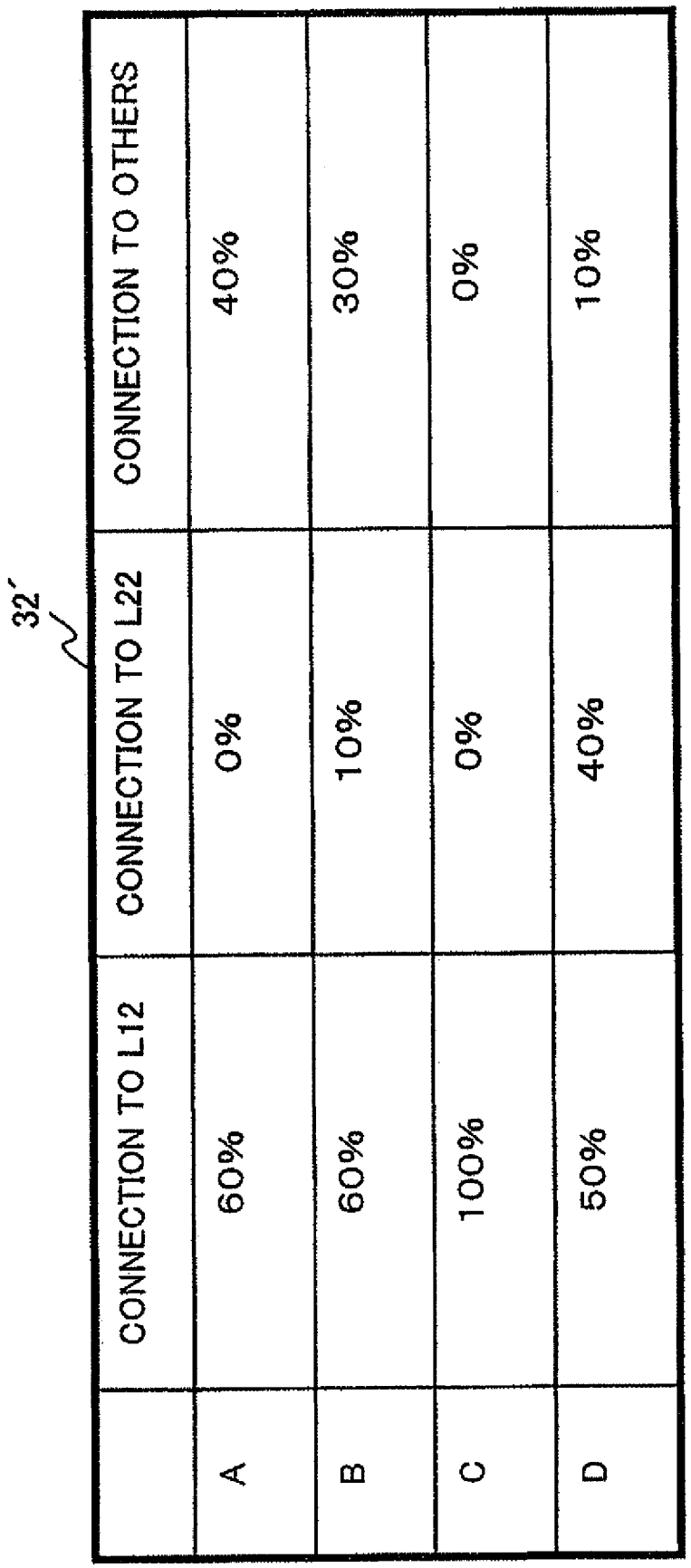
FIG. 23 is a diagram showing relationships of connection of internal components in the placement object forming a common area obtained by the third placement changer of the placement changer of the optimization section, displayed on the display section of the floorplanning apparatus according to the embodiment of this invention.

More specifically, in the case where a common area W6 is formed by a placement objects L12 an L22 as shown in FIG. 21 and internal components A to D of the placement object L12 and a plurality (here, four) of internal components of the placement object L22 are arranged in the common area W6 as shown in FIG. 22(a), the third placement changer 32b examines connection relationships of these internal components on the basis of data (placement object information) retained in the database 2, and displays a resultant connection relationship (connection rate) of each of the internal components (here, internal components A to D) on the display section 3 as a screen 32', as shown in FIG. 23. Incidentally, in FIG. 21, a reference character "CL12" denotes the center of the placement object L12, while a reference character "CL22" denotes the center of the placement object L22.

Then, the third placement object changer 32c changes arrangement of the internal components A to D on the basis of connection rates of the internal components A to D, as shown in FIG. 22(b). Here, the third placement object changer 32c arranges the internal component C onto a straight line X connecting the center WC6 of the common area W6 to the center CL12 of the placement object L12 in such a way that the internal component C contacts a side S of the common area W6 because the internal component C has the largest rate of connection (here, "100%") to the placement object L12 to which the internal component C itself belongs.

Internal components having the second highest connection rate next to the internal component C are internal components A and B which have both a connection rate of "60%". In this case, the third placement changer 32c determines the order of arrangement on the basis of other connection rates of these internal components A and B.

Here, the internal component A has a connection rate of "0%" to the placement object L22, whereas the internal component B has a connection rate of "10%" to the placement object L22. Since the internal component A has a lower rate of connection to the placement object L22 and a higher rate of connection to the others, the third placement changer 32c arranges secondary the internal component A.

Thereafter, the third placement changer 32c arranges the internal component B and the internal component D in order, thereby changing the arrangement of the internal components within the common area W6, as shown in FIG. 22(b).

Incidentally, in FIG. 22(b), a reference character "Y" denotes a straight line connecting the center WC6 of the common area W6 to the center CL22 of the placement object L22.

Since the internal components are gathered in a place within the common area closer to the placement object to which these internal components belong as above, it can be said that the third placement changer 32c can provide compaction effect. Further, since the center part of the common area becomes the non-used region, this region can be used for other internal components or used as a wiring reservation area.

Still Further, the third placement changer 32c can reduce the areas of placement objects (here, placement objects L12 and L22) through a shape changing process by the shape changer 33 to be described later.

As shown in FIG. 1, in order to cancel a common area formed by the common area former 12 in the temporary placement section 10, the shape changer 33 re-determines shapes of respective plural placement objects forming this common area on the basis of arrangement of internal components undergone the placement changing process by the placement changer 32 while using the common area to change the shapes of the placement objects, thereby optimizing the placement objects.

For instance, the common area former 12 changes shapes of placement objects L13 and L23 shown in FIG. 24(a) to ones shown in FIG. 24(b) to form a common area W7. When the placement changer 32 changes arrangement of internal components of the placement object L13 as shown in FIG. 24(c), the shape changer 33 changes shapes of the placement objects L13 and L23 on the basis of the internal components whose arrangement has been changed, as shown in FIG. 24(d).

In the example shown in FIGS. 24(a) through 24(d), the shapes of both the placement objects L13 and L23 are changed so that the areas of the placement objects L13 and L23 in the initial state (refer to FIG. 24(a)) are reduced, whereby the placement objects L13 and L23 are optimized.

Figures 25A, 25B, 25C, 25D:
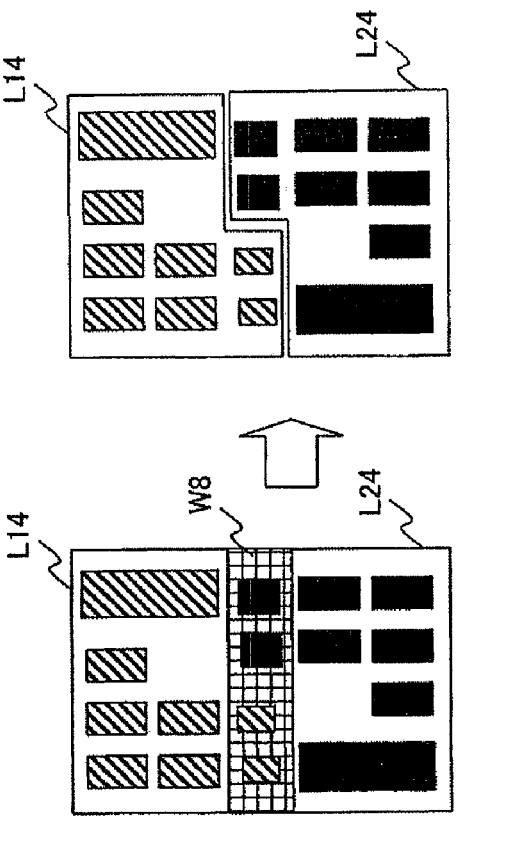

Further, for instance, the common area former 12 changes positions (here, position of the placement object L24) of placement objects L14 and L24 shown in FIG. 25(a) to form a common area W8 as shown in FIG. 25(b). When the placement changer 32 changes arrangement of internal components of the placement objects L14 and L24 as shown in FIG. 25(c), the shape changer 33 changes the shapes of the placement objects L14 and L24 as shown in FIG. 25(d) on the basis of the internal components whose arrangement has been changed.

In the example shown in FIGS. 25(a) through 25(d), the placement objects L14 and L24 are changed in shape from rectangular in the initial state (refer to FIG. 25(a)) to non-rectangular, and are optimized so that the area of the placement objects L14 and L24 are reduced as a result.

Next, description will be made of procedures of operation of the floorplanning apparatus 1.

First, a position of a floorplanning process by the floorplanning apparatus 1 in a design procedure for a semiconductor integrated circuit will be described with reference to a flowchart (Steps S1 to S11) shown in FIG. 26.

Figure 26:
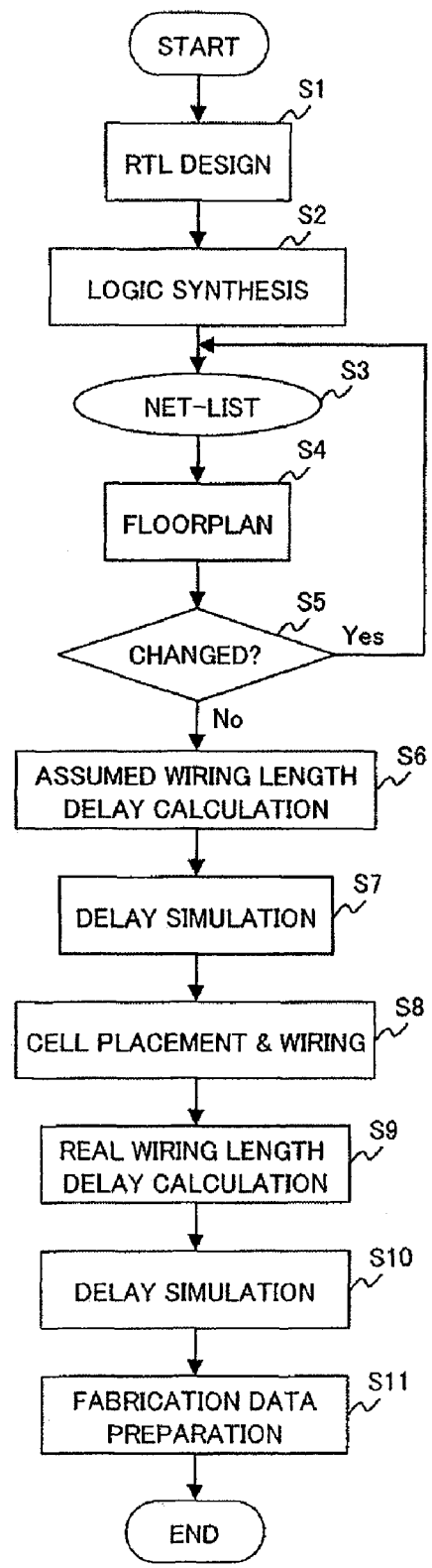
FIG. 26 is a flowchart showing a procedure of design of a semiconductor integrated circuit to which a floorplanning process by the floorplanning apparatus according to the embodiment of this invention is applied.

As shown in FIG. 26, in the design procedure for a semiconductor integrated circuit, RTL (Register Transfer Level) design is first carried out (Step 1). Hardware of the semiconductor integrated circuit is language-described in a hardware description language (HDL: Hardware Description Language), the hardware description language and aimed circuit performances (for example, timing, area, etc.) are then inputted to automatically generate a desired logic circuit (logic synthesis; Step S2).

On the basis of the logic circuit generated by logic synthesis (Step S2), a net-list is prepared (Step S3), and a floorplanning process by the floorplanning apparatus 1 is executed (Step S4) on the basis of the prepared net-list, etc.

When the floorplanning process (Step S4) makes a change in placement object (Yes route at Step S5), the procedure returns to the above at Step S3 to prepare a net-list (Step S3).

When the floorplanning process (Step 4) does not make any change in placement object (No route at Step S5), assumed wire length delay calculation for the semiconductor integrated circuit (Step S6) and delay simulation for the same (Step S7) are carried out, then cell placement and wiring are carried out (Step S8).

When the cell placement and wiring (Step S8) complete, real wiring length delay calculation (Step S9) and delay simulation (Step S10) are carried out, then final fabrication data for the semiconductor integrated circuit is prepared (Step S11), and the design process for the semiconductor integrated circuit is terminated.

In design of a semiconductor integrated circuit, when results of the delay calculation (Step S6 or Step S9) and the delay simulation (Step S7 or Step S10) show that the semiconductor integrated circuit does not satisfy desired performances (timing, etc.), it is general that the design is again changed, although not shown in FIG. 26.

Figure 27:
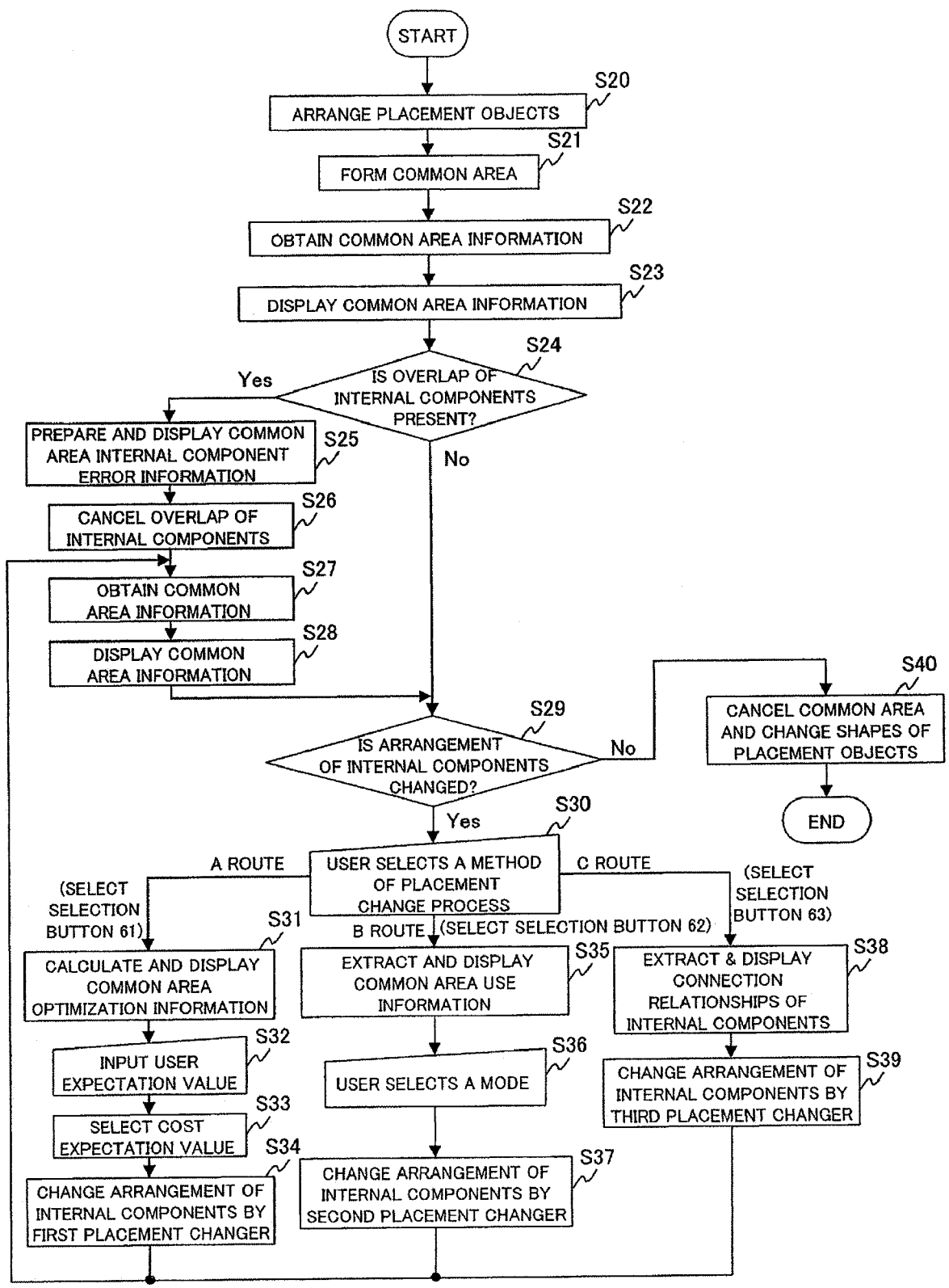
FIG. 27 is a flowchart showing a procedure of operation of the floorplanning apparatus according to the embodiment of this invention.

The floorplanning apparatus 1 carries out the floorplanning process, interacting with the user by means of the display section 3 and the input section 5, in a procedure shown in a flowchart (Steps S20 to S40) in FIG. 27.

As shown in FIG. 27, in the floorplanning apparatus 1, the placement section 11 of the temporary placement section 10 prepares placement objects on the basis of the placement object information retained in the database 2, and arranges the placement objects onto a mounting region on the basis of the net-list (Step S20).

The common area former 12 of the temporary placement section 10 then changes shapes and/or positions of the placement objects to form a common area (Step S21).

The common area former 12 obtains common area information on the formed common area (Step S22), and displays the common area information on the display section 3 (refer to above-mentioned FIGS. 6 to 8; Step S23).

The judgment section 31 of the optimization section 30 judges whether internal components of placement objects forming the common area overlap each other within the common area formed by the common area former 12 (that is, whether or not any overlap of the internal components is present) (Step S24).

When the judgment section 31 judges that overlap of the internal components is present (Yes route at Step S24) the judgment section 31 prepares common area internal component error information, and displays the common area internal component error information on the display section 3 (refer to the above-mentioned FIG. 15; Step S25). The placement changer 32 changes the position of at least one internal component of the internal components overlapping each other to cancel the overlapping (Step S26).

The optimization section 30 again obtains common area information on the common area where the overlap of the internal components has been cancelled (Step S27), and displays this common area information on the display section 3 (Step S28).

On the other hand, when the judgment section 31 judges that overlap of internal components is not present (No route at Step S24), the process at the above-mentioned Steps S25 to S28 is skipped.

Figure 28:
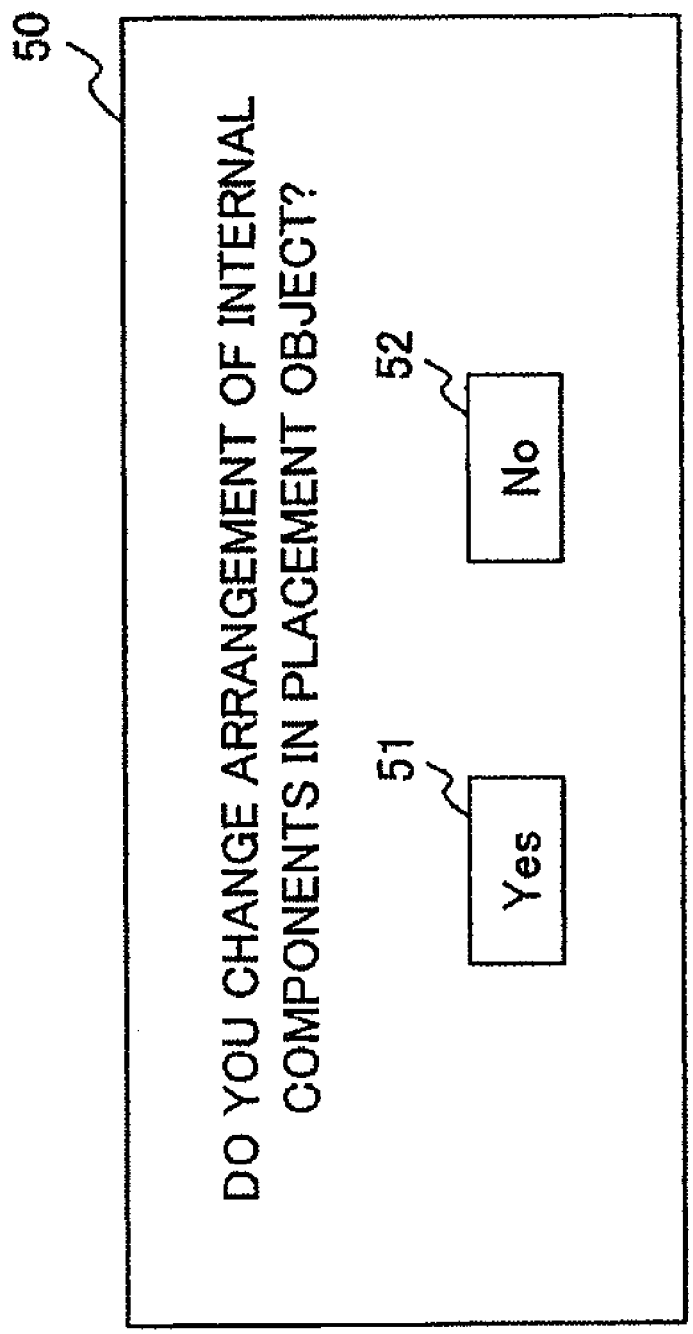
FIG. 28 is a diagram showing an example of display screen for prompting the user to confirm whether to change internal components of placement objects, displayed on the display section by the optimization section of the floorplanning apparatus according to the embodiment of this invention.

The user determines, with reference to the common area information displayed on the display section 3, whether to change arrangement of internal components of placement objects forming the common area, and inputs a determination thereon through the input section 5 (Step S29). In concrete, the optimization section 30 displays a display screen 50 on which a message to the user to confirm whether or not arrangement of internal components is changed, and a Yes button 51 and a No button 52 are displayed, as shown in FIG. 28. The user determines whether or not to carry out the placement changing process on the internal components on the basis of the common area information, and clicks the Yes button 51 or the No button 52 as a response thereto by operating the mouse.

When the user clicks the Yes button 51 (that is, when arrangement of the internal components is changed; Yes route at Step S29), the user consecutively selects a method of the placement changing process on the internal components (Step S30).

More specifically, at Step S30, the user inputs through the input unit 5 which one of the first placement changer 32a, the second placement changer 32b or the third placement changer 32c should carry out the placement changing process.

Figure 29:
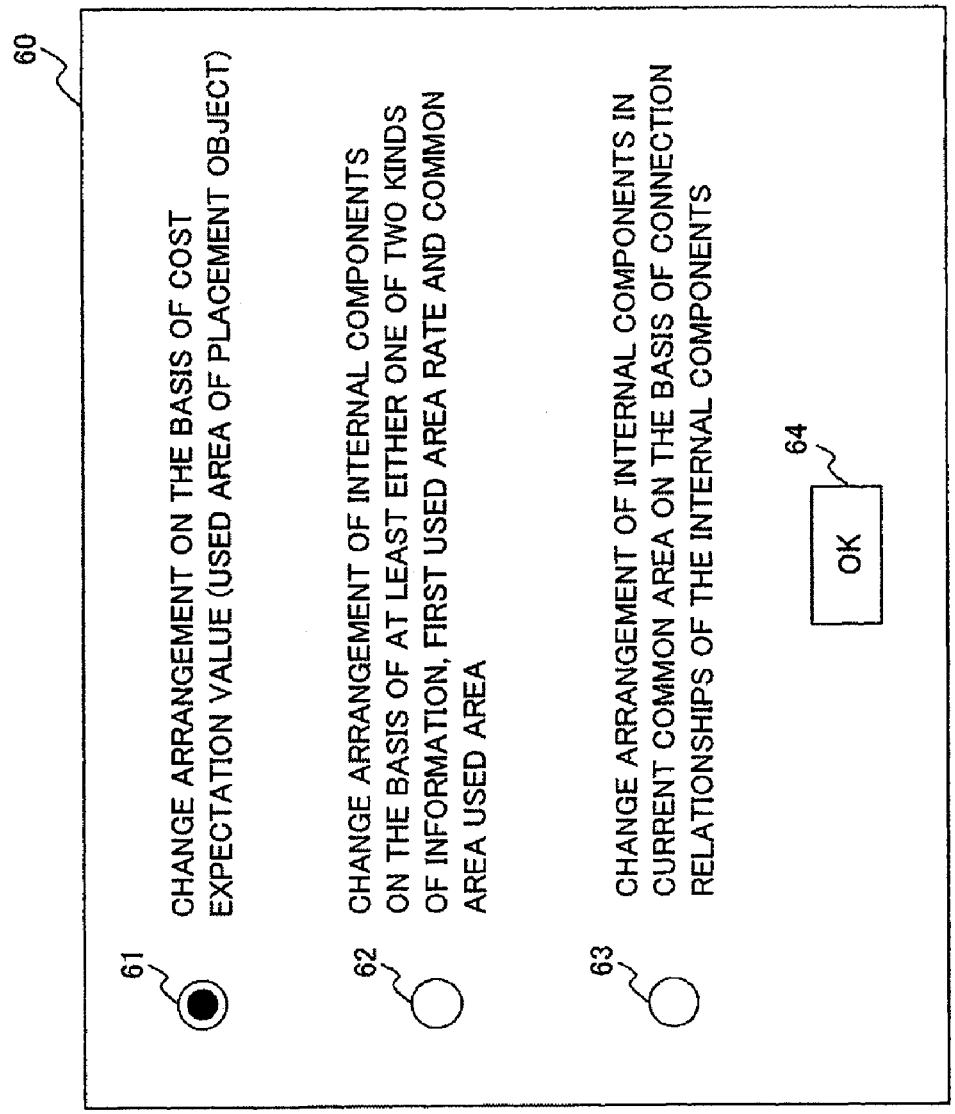
FIG. 29 is a diagram showing an example of selection screen for selecting a method of the placement changing process on internal components of placement objects, displayed on the display section by the placement changer of the optimization section of the floorplanning apparatus according to the embodiment of this invention.

In concrete, the placement changer 32 of the optimization section 30 displays a selection screen 60 for selecting a method of the placement changing process on the display section 60 as shown in FIG. 29, for example. The selection screen 60 shown in FIG. 29 includes explanation of three methods of the placement changing process, selection buttons 61 through 63 corresponding to these three methods of the placement changing process, respectively, and an OK button 64.

The user moves a pointer by operating the mouse, selects one button by clicking the mouse on a desired selection button

61, 62 or 63, clicks the OK button 64, thereby selecting a method of the placement changing process corresponding to the selected button.

Here, when the arrangement is changed on the basis of the cost expectation value (used area of each placement object) (that is, when the first placement changer 32a carries out the placement changing process), the selection button 61 is selected by the user.

FIG. 29 shows a state in which the selection button 61 is selected.

When the arrangement of internal elements is changed on the basis of information on at least either the first used area rate or the common area used area of placement object (that is, when the second placement changer 32b carries out the placement changing process), the selection button 62 is selected by the user.

As an explanatory sentence for making the second placement changer 32b carry out the placement changing process, "internal component outside the common area is assigned in order to aggressively use the common area" may be employed, other than the example shown in FIG. 29. The explanatory sentence is not limited to the example shown in FIG. 29, hence other sentence may be employed.

When the arrangement of internal components in the current common area is changed on the basis of connection relationships of the internal components (that is, when the third placement changer 32c carries out the placement changing process), the selection button 63 is selected by the user.

When the user selects the selection button 61 (A route at Step S30), the logic cost expectation value calculator 21, the mounting cost expectation value calculator 22 and the overall cost expectation value calculator 23 of the expectation value calculator 20 calculate respective cost expectation values, and display results of the calculation on the display section 3 (Step S31). At the same time, the user inputs a user expectation value using a keyboard or the like (Step S32). Whereby, information on cost expectation values as shown in the above-mentioned FIGS. 11(*a*) through 11(*e*) and 14(*a*) through 14(*d*) is displayed on the display section 3.

The first placement changer 32a selects one cost expectation value among the logic cost expectation value, the mounting cost expectation value and the overall cost expectation value on the basis of the user expectation value (Step S33), and the first placement changer 32a changes the arrangement of internal components of placement objects forming the common area on the basis of this cost expectation value (Step S34).

On the other hand, when the user selects the selection button 62 (B route at Step S30), the second placement changer 32b extracts common area use information (resultant value), and displays the common area use information on the display section 3 as shown in FIGS. 17(*a*) and 17(*b*) (Step S35).

The user refers to this common area use information, and selects how to change arrangement of the internal components (Step S36).

In other words, at Step S36, the user uses the input section 5 to input in which mode among the first to third modes the second placement changer 32b should carry out the process.

Figure 30:
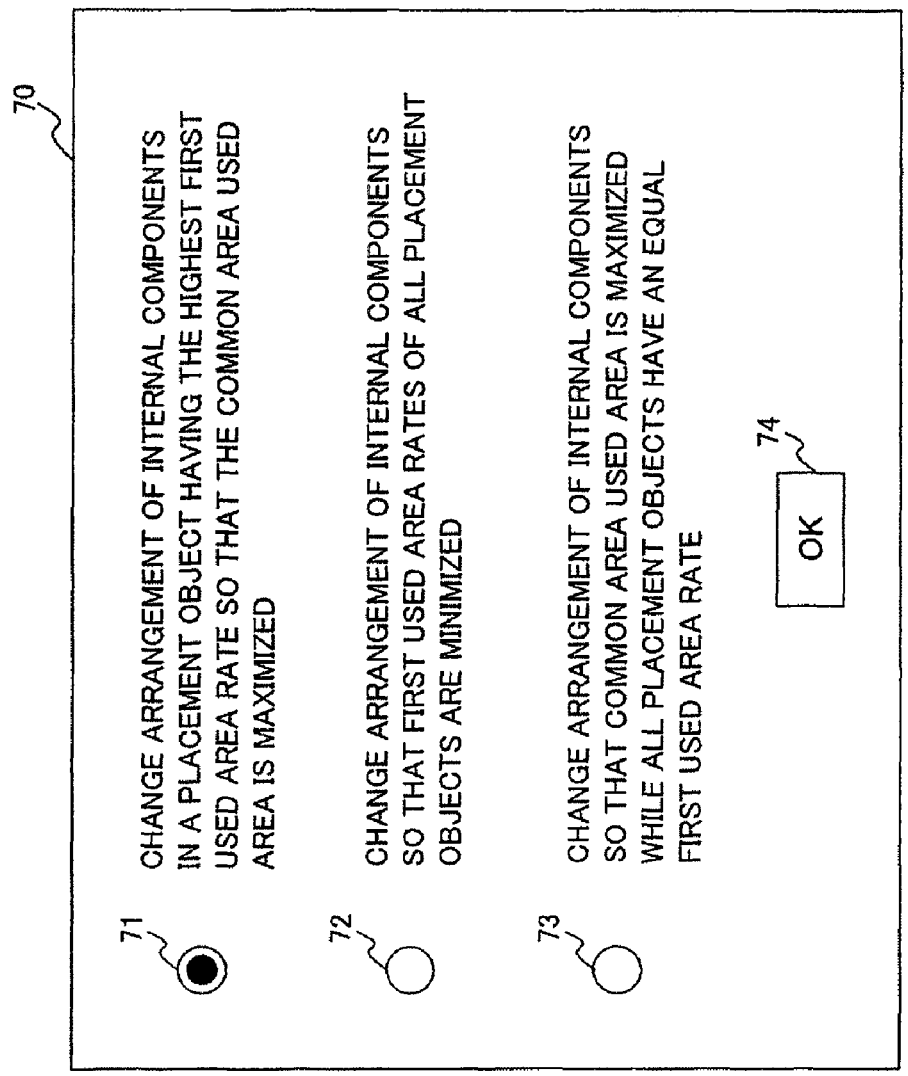
FIG. 30 is a diagram showing an example of selection screen for selecting a mode of the placement changing process, displayed on the display section by the second placement changer of the placement changer of the optimization section of the floorplanning apparatus according to the embodiment of this invention.

In concrete, the second placement changer 32b displays a selection screen 70 for selecting a mode of the placement changing process as shown in FIG. 30 on the display section 3, for example. The selection screen 70 shown in FIG. 30 includes explanation of three modes (that is, the first to third modes) of the placement changing process, selection buttons 71 to 73 corresponding to the respective three modes and an OK button 74.

The user operates the mouse to move the pointer, clicks the mouse on a desired selection button 71, 72 or 73 to select a button, then clicks the OK button 74, whereby a mode of the placement changing process corresponding to a selected button is selected.

Here, when arrangement of internal components of a placement object having the highest first used area rate is changed so that the common area used area is maximized (that is, when the placement changing process is carried out in the first mode), the selection button 71 is selected by the user.

FIG. 30 shows a state where the selection button 71 is selected.

When arrangement of internal components is changed so that the first used area rates of all the placement objects are the lowest first used area rate (that is, when the placement changing process is carried out in the second mode), the selection button 72 is selected by the user.

When arrangement of internal components is changed so that the common area used area is maximized while the first used area rates of all the placement objects are equal (that is, the placement changing process is carried out in the third mode), the selection button 73 is selected by the user.

The second placement changer 32b changes the arrangement of internal components in an operation mode selected by the user at the above Step S36 (Step S37).

At this time, it is preferable that the second placement changer 32b display any one of the plural kinds of common area use information shown in the above FIGS. 18(*a*), 18(*b*), 19(*a*), 19(*b*), 20(*a*) and 20(*b*) on the display section 3 according to the operation mode.

When the user selects the selection button 63 at the above Step S30 (C route at Step S30), the third placement changer 32c extracts a connection relationship (connection rate) of each of internal elements existing within the common area on the basis of data retained in the database 2, and displays the connection relationships on the display section 3 as shown in the above-mentioned FIG. 23 (Step S38).

Next, the third placement changer 32c changes arrangement of the internal components in the common area on the basis of the connection relationships of the internal components in the fashion described above with reference to FIGS. 22(*a*) and 22(*b*) (Step S39).

After the above-mentioned placement changing process (Step S34) by the first placement changer 32a, after the placement changing process (step S37) by the second placement changer 32b or after the placement changing process (Step S39) by the third placement changer 32c, the process at the above-mentioned Steps S27 and S28 is again carried out, and the procedure returns to the above-mentioned process at Step S29.

When the user determines not to change arrangement of internal components at Step S29 (that is, when the user selects (clicks) the No button 52 on the display screen 50) at this Step S29 (No route at Step S29), the shape changer 33 of the optimization section 30 cancels the common area on the basis of the changed arrangement of the internal components, re-forms the placement objects having formed the common area (Step S40), and terminates the process.

In the floorplanning apparatus 1, the procedure proceeds to the above-mentioned process at Step S30 until the user determines not to change the arrangement of the internal components at the above-mentioned Step S29, and the placement changer 32 carries out the placement changing process on the internal components.

In the process by the shape changer 33 at the above Step S40, it is preferable to determine shapes of placement objects so that the shapes of the placement objects are smaller than their original shapes before their shapes and positions are changed in order that the placement objects form a common area, as described above with reference to FIGS. 24(a) through 24(d) and 25(a) through 25(d).

According to the floorplanning apparatus 1 as an embodiment of this invention, the common area former 12 of the temporary placement section 10 forms a common area, and the placement changer 32 of the optimization section 30 changes arrangement of internal components of placement objects forming the common area while using the common area to optimize the placement objects. Therefore, the arrangement of the internal components of the placement objects is re-designed so that the plural placement objects share the common area. As a result, it is possible to reduce the dimensions of the semiconductor integrated circuit, and decrease the dead space.

Since the placement object is not formed into a complex polygon to reduce the area of the placement object, it is possible to secure freedom of placement and wiring of internal components of the placement object, and to suppress an increase of constraints of the CAD system.

Conventionally, the design is generally so performed as not to generate overlap of placement objects, using various arbitrary non-rectangular shapes. To the contrary, the floorplanning apparatus 1 intentionally generates overlap (common area) of placement objects, and the optimization section 30 changes arrangement of internal components of the placement objects so that the placement objects forming the common area use the common area, friendly and aggressively. This can provide the above effects.

The placement section 11 arranges the internal components onto the mounting region, then the common area former 12 forms the common area, so that the common area can be formed with certainty.

Further, the common area former 12 allows the user to readily form a common area with desired placement objects.

Since the shape changer 33 of the optimization section 30 changes shapes of placement objects in which arrangement of internal components has been changed by the placement changer 32, it is possible to reduce the sizes of the placement objects by this shape changing process.

Since the judgment section 31 of the optimization section 30 judges presence/absence of overlap of internal components in the common area, and when the judgment section 31 judges that overlap is present, the placement changer 32 changes arrangement of the internal components in order to cancel the overlap. This is effective to prevent a mistake in design with certainty.

Since the first placement changer 32a of the placement changer 32 of the optimization section 30 changes arrangement of internal components on the basis of a logic cost expectation value calculated by the logic cost expectation value calculator 21 of the expectation value calculator 20, it is possible to effectively change arrangement of internal components of the placement objects so that connection relationships of the internal components in each of the placement objects are optimized.

Since the first placement changer 32a of the placement changer 32 of the optimization section 30 changes arrangement of internal components on the basis of a mounting cost expectation value calculated by the mounting cost expectation value calculator 22 of the expectation value calculator 20, it is possible to effectively change arrangement of internal components of placement objects so that connection relationships thereof to other placement object are optimized.

Since the first placement changer 32a of the placement changer 32 of the optimization section 30 changes arrangement of internal components on the basis of an overall cost expectation value calculated by the overall cost expectation value calculator 23 of the expectation value calculator 20, it is possible to effectively change arrangement of internal components of a placement object so that a balance between connection relationships inside this placement object and connection relationships to other placement object can be kept.

The first placement changer 32a of the placement changer 32 of the optimization section 30 automatically selects a cost expectation value to be used for the placement changing process among a logic cost expectation value, a mounting cost expectation value and an overall cost expectation value on the basis of a user expectation value inputted by the user through the input section 5. Whereby, the user can efficiently change arrangement of internal components of placement objects only by inputting a desired value to efficiently use a non-used area within the common area in an optimum floorplan (that is, on the basis of an optimum cost expectation value).

Figure 11:
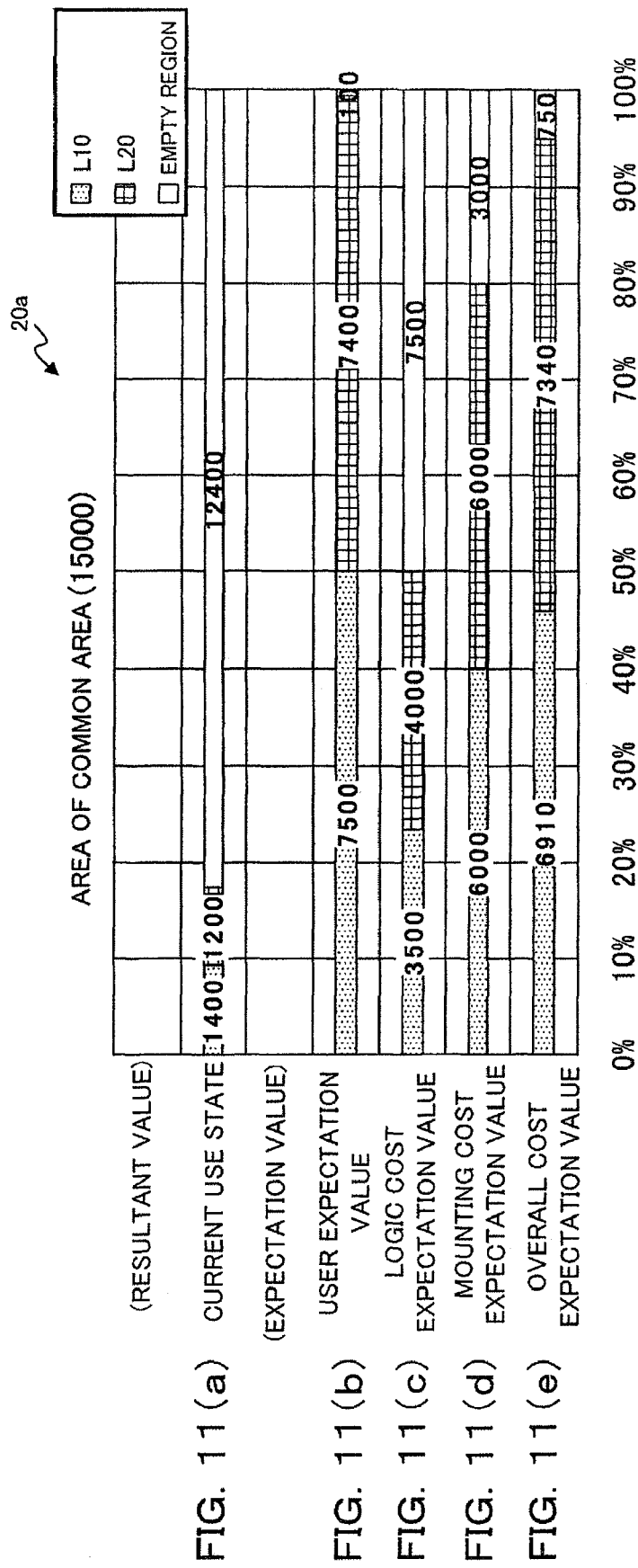

At this time, the first placement changer 32a displays a current resultant value in the common area on the display section 3 along with each of cost expectation values, and also displays common area use constitution information on the display section 3, as shown in the above-mentioned FIGS. 11 and 14. Whereby, the user can adjust increase/decrease of internal components in the common area while referring to the information shown in FIGS. 11 and 14, thereby to perform optimum floorplanning.

The second placement changer 32b of the placement changer 32 of the optimization section 30 carries out the placement changing process on internal components, using at least either information on the first used area rates of placement objects or information on common area used areas (dimensions) of the placement objects. Whereby, it is possible to efficiently change a rate of internal components within the common area or a rate of internal components within the exclusive region to a value desired by the user while designating a placement object, by changing arrangement of the internal components in the placement object forming the common area.

The third placement changer 32c of the placement changer 32 of the optimization section 30 carries out arrangement of internal components in a common area on the basis of connection relationships of the internal components. The third placement changer 32c changes the position of an internal component having a larger rate of connection to a placement object to which the internal component belongs to a position closer to the center or the gravity of the placement object to which the internal component belongs. Whereby, it is possible to provide an effect of compaction of the internal components.

Since possibility that the center portion of the common area becomes a non-used area is increased with this placement changing process by the third placement changer 32c, it is possible to add assignment of other internal component, and to decrease the dead space.

The first placement changer 32a, the second placement changer 32b and the third placement changer 32c of the placement changer 32 change arrangement of internal components forming a common area, whereby the design period can be shortened by carrying out an efficient floorplanning process and the size of the semiconductor integrated circuit can be reduced by efficiently using the common area.

The floorplanning apparatus 1 carries out the floorplanning process interactively with the user while displaying various kinds of information on the display section 3 by means of the display section 3, the display controller 4 and the input section 5. This enables efficient division design.

[2] Others

Note that the present invention is not limited to the above-described embodiment, but may be modified in various ways without departing from the scope and spirit of the present invention.

The above embodiment has been described by way of example where the placement changer 32 of the optimization section 30 has the first to third placement changers 32a to 32c, but the present invention is not limited to this example. Any one of the first to third placement changers 32a, 32b and 32c suffices.

In the present invention, the methods of the placement changing process by the first to third placement changers 32a to 32c are not limited to the above-described embodiment.

For instance, the process by the first placement section 32a can be carried out by selecting any one among a logic cost expectation value, a mounting cost value and an overall cost expectation value by the user, directly and manually.

The placement changing process by the second placement changer 32b is not limited to the above-described first to third modes. The placement changing process can be carried out, using at least the first used area rate or the common area used area, on the basis of these values.

In the embodiment described above, when the common area former 12 forms a common area, it is alternatively possible to set beforehand limitation of use for each placement object in a predetermined region (for example, a region added in order to deform a non-rectangular placement object to rectangular) to set beforehand a placement object that can use the predetermined region in the common area or a rate of the use. Whereby, efficient floorplanning process can be realized.

Figure 31A:
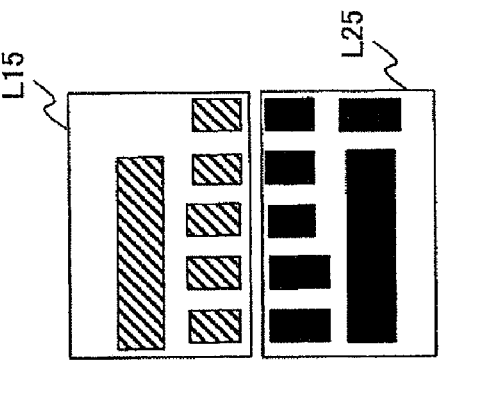
Figure 31B:
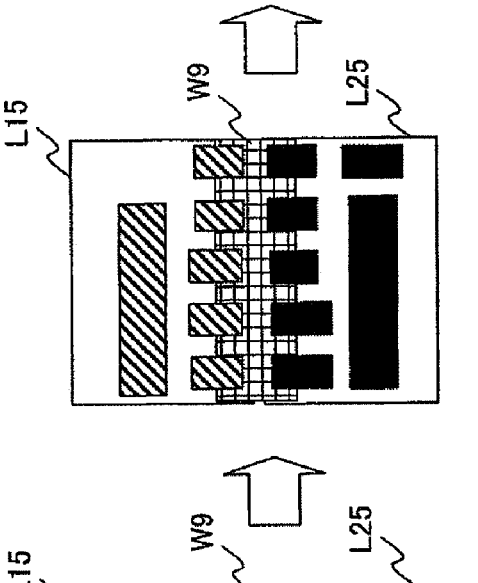
Figure 31C:
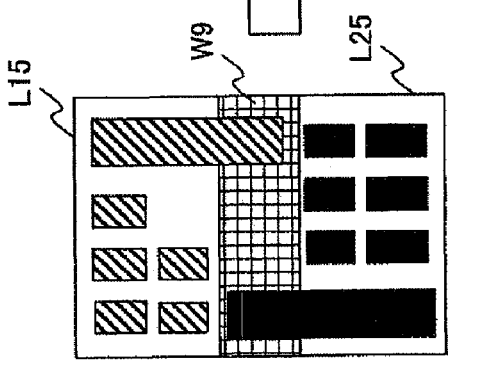

The above embodiment has been described by way of example where internal components in a common area are completely arranged within the common area through the placement changing process by the placement changer 32 (for example, refer to FIGS. 18(a) through 20(a) mentioned above). However, the present invention is not limited to this example. For instance, as shown in FIGS. 31(a) through 31(d), when the common area former 12 changes shapes and positions of placement objects L15 and L25 shown in FIG. 31(a) to form a common area W9 as shown in FIG. 31(b), the placement changer 32 (that is, any one of the first to third placement changers 32a to 32c) can arrange internal components in such a way that an internal component stretches over both the common area W9 and an exclusive region of the placement object L15 or L25, as shown in FIG. 31(c).

Figure 31D:
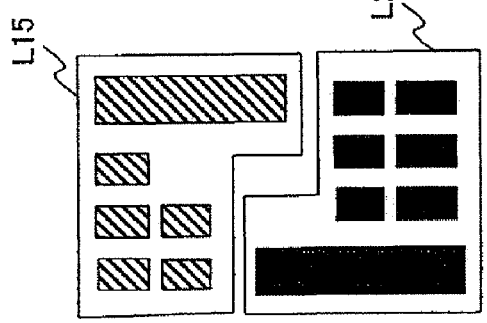
Figure 32:
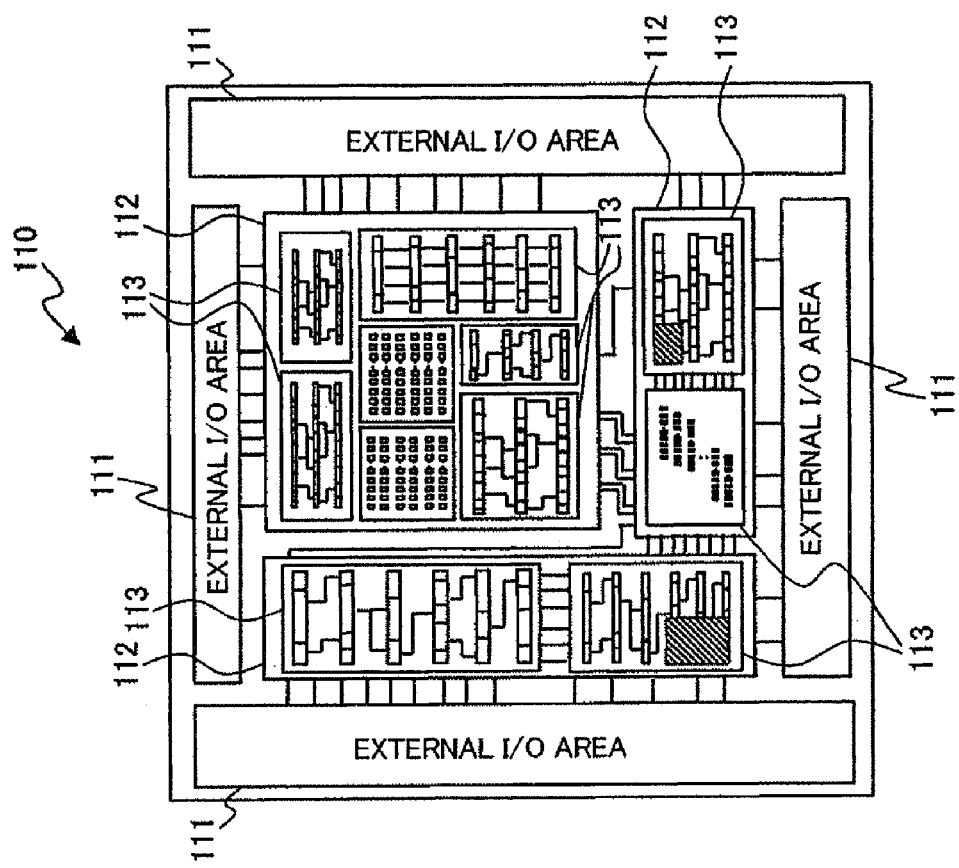
FIG. 32 is a schematic diagram showing an example of semiconductor integrated circuit that is an object of the floorplanning apparatus according to this invention.

In this case, the shape changer 33 can change the shapes of the placement objects L15 and L25 as shown in FIG. 31(d), which can provide the same effects as the above-described embodiment.

The functions as the display controller 4, the placement section 11, common area former 12, the logic cost expectation value calculator 21, the mounting cost expectation value calculator 22, the overall cost expectation value calculator 23, the optimization section 30, the judgment section 31, the placement changer 32, the first placement changer 32a, the second placement changer 32b, the third placement changer 32c and the shape changer 33 can be realized by a computer (including a CPU, an information processing device, and various terminals) that executes a predetermined application program (floorplanning program).

The program is provided in a form recorded in a computer-readable recording medium such as a flexible disc, CD (CD-ROM, CD-R, CD-RW, etc.), a DVD (DVD-ROM, DVD-RAM, DVD-R, DVD-RW, DVD+R, DVD+RW, etc.), etc. In this case, the computer reads the floorplanning program from the recording medium, transfers it to an internal storage device or an external storage device, and stores it for use.

Further, the program may be recorded in a storage device (a recording medium) such as a magnetic disc, an optical disc, an opto-magnetic disc or the like and provided to a computer from the storage device via a communication line.

Here, a computer is a concept including hardware and an OS (operating system) and means hardware that operates under the control of the OS. Further, when hardware is operated with an application program alone without an OS, the hardware itself corresponds to a computer. Hardware is provided with at least a microprocessor such as CPU an a means to read a program recorded in a recording medium.

An application program as the above-mentioned floorplanning program includes program code for causing a computer to realize the functions as the display controller 4, the placement section 11, the common area former 12, the logic cost expectation value calculator 21, the mounting cost expectation value calculator 22, the overall cost expectation value calculator 23, the optimization section 30, the judgment section 31, the placement changer 32, the first placement changer 32a, the second placement changer 32b, the third placement changer 32c and the shape changer 33. Alternatively, part of the functions may be realized not by an application program but by an OS.

Furthermore, as the recording medium in the present embodiment, in addition to the flexible disc, CD, DVD, magnetic disc, optical disc, or opto-magnetic disc, a variety of computer-readable media such as an IC card, ROM cartridge, magnetic disk, punch card, internal storage device (memory as RAM, ROM, etc.) of a computer, an external storage device, and a printing on which code such as bar code is printed may be used.

What is claimed is:

1. A floorplanning apparatus performing a process of arranging a plurality of placement object blocks, in each of which internal component is arranged, onto a mounting region, the floorplanning apparatus comprising:
   a temporary placement section that temporarily arranges the plurality of placement object blocks onto the mounting region so that at least two placement object blocks among the plurality of placement object blocks overlap each other to form an overlap region; and
   an optimization section that changes arrangement of the internal component in at least one placement object block among the placement object blocks forming the overlap region in such a manner that the internal component is set into the overlap region to optimize said at least one placement object block, wherein the temporary placement section comprises:
   a placement section that arranges the plurality of placement object blocks onto the mounting region so that the plurality of placement object blocks do not overlap each other; and
   an overlap region former that changes a position and/or a shape of at least one placement object block among the plurality of placement object blocks arranged by the placement section to form the overlap region.

2. The floorplanning apparatus according to claim 1, wherein the overlap region former deforms a non-rectangular placement object into a rectangular shape.

3. A floorplanning apparatus performing a process of arranging a plurality of placement object blocks, in each of which internal component is arranged, onto a mounting region, the floorplanning apparatus comprising:

a temporary placement section that temporarily arranges the plurality of placement object blocks onto the mounting region so that at least two placement object blocks among the plurality of placement object blocks overlap each other to form an overlap region; and an optimization section that changes arrangement of the internal component in at least one placement object block among the placement object blocks forming the overlap region in such a manner that the internal component is set into the overlap region to optimize said at least one placement object block, wherein the optimization section changes arrangement of the internal component in at least one placement object block among the placement object blocks forming the overlap region and changes a shape of the placement object block in which the arrangement of the internal component has been changed.

4. The floorplanning apparatus according to claim 3, wherein the optimization section judges whether or not the internal components in the plurality of placement object blocks forming the overlap region interfere with each other in the overlap region, and changes a position of at least one internal component among the internal components interfering with each other to solve the interference when judging that the internal components interfere with each other.

5. The floorplanning apparatus according to claim 3, wherein the optimization section performs arrangement of the internal component in the overlap region on the basis of connection relationships among the internal components.

6. A floorplanning apparatus performing a process of arranging a plurality of placement object blocks, in each of which internal component is arranged, onto a mounting region, the floorplanning apparatus comprising:

a temporary placement section that temporarily arranges the plurality of placement object blocks onto the mounting region so that at least two placement object blocks among the plurality of placement object blocks overlap each other to form an overlap region; and an optimization section that changes arrangement of the internal component in at least one placement object block among the placement object blocks forming the overlap region in such a manner that the internal component is set into the overlap region to optimize said at least one placement object block, wherein the optimization section changes arrangement of the internal component with the use of at least either a rate of area (hereinafter, referred to as a first used area rate) occupied by internal component in each of the placement object blocks forming the overlap region, in an exclusive region which is obtained by taking away the overlap region from a whole area of the placement object block, or an area (hereinafter, referred to as an overlap region used area) occupied by internal component in each of the placement object blocks forming the overlap region in the overlap region.

7. The floorplanning apparatus according to claim 6, wherein the optimization section moves the internal component in the exclusive region of the placement object block into the overlap region to change arrangement of the internal component.

8. The floorplanning apparatus according to claim 6, wherein the optimization section changes arrangement of the internal component in a placement object block having the highest first used area rate among the placement object bocks forming the overlap region so that the overlap region used area is maximized.

9. The floorplanning apparatus according to claim 6, wherein, when the overlap region is formed by two placement object blocks, the optimization section changes arrangement of the internal component in one placement object block having the highest first used area rate between the two placement object blocks so that the first used area rate of the one placement object block is equal to the first used area rate of the other placement object block.

10. The floorplanning apparatus according to claim 6, wherein the optimization section changes arrangement of the internal component in the placement object blocks so that the overlap region used area is maximized while the first used area rates of the placement object blocks forming the overlap region are equalized.

11. A floorplanning apparatus performing a process of arranging a plurality of placement object blocks, in each of which internal component is arranged, onto a mounting region, the floorplanning apparatus comprising:

a temporary placement section that temporarily arranges the plurality of placement object blocks onto the mounting region so that at least two placement object blocks among the plurality of placement object blocks overlap each other to form an overlap region; and an optimization section that changes arrangement of the internal component in at least one placement object block among the placement object blocks forming the overlap region in such a manner that the internal component is set into the overlap region to optimize said at least one placement object block, wherein the optimization section changes arrangement of the internal component according to a logic cost expectation value calculated on the basis of connection relationships among the internal components within the placement object block.

12. A floorplanning apparatus performing a process of arranging a plurality of placement object blocks, in each of which internal component is arranged, onto a mounting region, the floorplanning apparatus comprising:

a temporary placement section that temporarily arranges the plurality of placement object blocks onto the mounting region so that at least two placement object blocks among the plurality of placement object blocks overlap each other to form an overlap region; and an optimization section that changes arrangement of the internal component in at least one placement object block among the placement object blocks forming the overlap region in such a manner that the internal component is set into the overlap region to optimize said at least one placement object block, wherein the optimization section changes arrangement of the internal component according to a mounting cost expectation value calculated on the basis of connection relationships between the internal component in the placement object block and internal component in the other placement object block.

13. A floorplanning apparatus performing a process of arranging a plurality of placement object blocks, in each of which internal component is arranged, onto a mounting region, the floorplanning apparatus comprising:

a temporary placement section that temporarily arranges the plurality of placement object blocks onto the mounting region so that at least two placement object blocks among the plurality of placement object blocks overlap each other to form an overlap region; and an optimization section that changes arrangement of the internal component in at least one placement object block among the placement object blocks forming the overlap region in such a manner that the internal component is set into the overlap region to optimize said at least one placement object block, wherein the optimization section changes arrangement of the internal component according to an overall cost expectation value calculated on the basis of a logic cost expectation value calculated on the basis of connection relationships among the internal components within a placement object block and a mounting cost expectation value calculated on the basis of connection relationships between the internal component in the placement object block and internal component in other placement object block.

14. A floorplanning apparatus performing a process of arranging a plurality of placement object blocks, in each of which internal component is arranged, onto a mounting region, the floorplanning apparatus comprising:
  a temporary placement section that temporarily arranges the plurality of placement object blocks onto the mounting region so that at least two placement object blocks among the plurality of placement object blocks overlap each other to form an overlap region;
  an optimization section that changes arrangement of the internal component in at least one placement object block among the placement object blocks forming the overlap region in such a manner that the internal component is set into the overlap region to optimize said at least one placement object block;
  a display section that displays information about the arrangement process; and
  an input section that inputs response information for data displayed on the display section;
  the optimization section that performs various setting on the basis of the response information inputted through the input section.

15. A non-transitory computer-readable storage medium storing a floorplanning program causing a computer to realize a function of performing a process of arranging a plurality of placement object blocks, in each of which internal component is arranged, onto a mounting region, the computer program causing the computer to function as:
  a temporary placement section that temporarily arranges the plurality of placement object blocks onto the mounting area so that at least two placement object blocks among the plurality of placement object blocks overlap each other to form an overlap region; and
  an optimization section that changes arrangement of the internal component in at least one placement object block among the placement object blocks forming the overlap region in such a manner that the internal component is set into the overlap region to optimize said at least one placement object block, wherein, when causing the computer to function as the temporary placement section, the floorplanning program causes the computer to function as:
  a placement section that arranges the plurality of placement object blocks onto the mounting region so that the plural placement object blocks do not overlap each other; and
  an overlap region former that changes a position and/or a shape of at least one placement object block among the plurality of placement object blocks arranged by the placement section to form the overlap region.

16. A non-transitory computer-readable storage medium storing a floorplanning program causing a computer to realize a function of performing a process of arranging a plurality of placement object blocks, in each of which internal component is arranged, onto a mounting region, the computer program causing the computer to function as:
  a temporary placement section that temporarily arranges the plurality of placement object blocks onto the mounting area so that at least two placement object blocks among the plurality of placement object blocks overlap each other to form an overlap region; and
  an optimization section that changes arrangement of the internal component in at least one placement object block among the placement object blocks forming the overlap region in such a manner that the internal component is set into the overlap region to optimize said at least one placement object block, wherein the floorplanning program causes the computer to function such that the optimization section changes arrangement of the internal component in at least one placement object block among the placement object blocks forming the overlap region and changes a shape of the placement object block in which the arrangement of the internal component has been changed.

* * * * *